US012157663B2

(12) United States Patent
Chang et al.

(10) Patent No.: US 12,157,663 B2
(45) Date of Patent: Dec. 3, 2024

(54) VENTING DEVICE, MANUFACTURING METHOD OF VENTING DEVICE, VENTING METHOD AND DEVICE

(71) Applicant: xMEMS Labs, Inc., Santa Clara, CA (US)

(72) Inventors: Chun-I Chang, Hsinchu County (TW); Wen-Chien Chen, New Taipei (TW); Chiung C. Lo, San Jose, CA (US); Kuan-Ju Tseng, Hsinchu (TW); Jemm Yue Liang, Sunnyvale, CA (US); Martin George Lim, Hillsborough, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/638,730

(22) Filed: Apr. 18, 2024

(65) Prior Publication Data

US 2024/0262679 A1 Aug. 8, 2024

Related U.S. Application Data

(60) Continuation-in-part of application No. 17/955,562, filed on Sep. 29, 2022, which is a division of
(Continued)

(51) Int. Cl.
*B81B 3/00* (2006.01)
*H04R 31/00* (2006.01)

(52) U.S. Cl.
CPC .......... *B81B 3/0021* (2013.01); *B81B 3/0051* (2013.01); *B81B 3/0072* (2013.01);
(Continued)

(58) Field of Classification Search
CPC ............. F16K 99/0048; F16K 99/0015; H04R 1/1091; H04R 1/10; H04R 2201/003;
(Continued)

(56) References Cited

U.S. PATENT DOCUMENTS

| 5,970,998 A | 10/1999 | Talbot |
| 8,532,320 B2 | 9/2013 | Nordahn |

(Continued)

FOREIGN PATENT DOCUMENTS

| CN | 101785327 A | 7/2010 |
| CN | 104540776 A | 4/2015 |

(Continued)

OTHER PUBLICATIONS

Liang, the specifiction, including the claims and drawings in the U.S. Appl. No. 17/344,983, filed Jun. 11, 2021.
(Continued)

*Primary Examiner* — Carolyn R Edwards
*Assistant Examiner* — Julie X Dang
(74) *Attorney, Agent, or Firm* — Winston Hsu

(57) ABSTRACT

A venting device includes an anchor structure and a membrane. The membrane is anchored on the anchor structure and configured to form a first vent and a second vent. The membrane includes a first flap, a second flap and a third flap. The membrane partitions a space into a first volume and a second volume, and the first volume and the second volume are connected when the first vent and the second vent are formed. The first flap is actuated to move toward a first direction and the second flap is actuated to move toward a second direction opposite to the first direction, so as to form the first vent. The first flap is actuated to move toward the first direction and the third flap is actuated to move toward the second direction opposite to the first direction, so as to form the second vent.

27 Claims, 24 Drawing Sheets

Related U.S. Application Data application No. 17/842,810, filed on Jun. 17, 2022, now Pat. No. 11,884,535, which is a continuation-in-part of application No. 17/344,980, filed on Jun. 11, 2021, now Pat. No. 11,399,228.

(60) Provisional application No. 63/050,763, filed on Jul. 11, 2020, provisional application No. 63/051,885, filed on Jul. 14, 2020, provisional application No. 63/171,919, filed on Apr. 7, 2021, provisional application No. 63/320,703, filed on Mar. 17, 2022, provisional application No. 63/468,277, filed on May 23, 2023, provisional application No. 63/536,480, filed on Sep. 4, 2023.

(52) U.S. Cl.
CPC ...... *H04R 31/00* (2013.01); *B81B 2201/0257* (2013.01); *B81B 2203/0127* (2013.01); *B81B 2203/0163* (2013.01); *B81B 2207/03* (2013.01)

(58) Field of Classification Search
CPC ............ H04R 2460/11; H04R 2460/01; H04R 1/1016; H04R 1/1083; H04R 17/00; H04R 1/22; H04R 17/02; H04R 31/00; H04R 1/04; H04R 1/023; H04R 1/403; B81B 7/02; B81B 3/0037; B81B 2201/032; B81B 2201/0257; B81C 1/00134; H10N 30/2041; H10N 30/2044
See application file for complete search history.

(56) References Cited

U.S. PATENT DOCUMENTS

| | | | |
|---|---|---|---|
| 8,724,200 B1 | 5/2014 | Wu | |
| 10,067,734 B2 | 9/2018 | Watson | |
| 10,367,540 B1 | 7/2019 | Medapalli | |
| 11,323,797 B2 | 5/2022 | Liang | |
| 11,399,228 B2 | 7/2022 | Liang | |
| 2003/0029705 A1 | 2/2003 | Qiu | |
| 2006/0131163 A1 | 6/2006 | Mei | |
| 2007/0007858 A1 | 1/2007 | Sorensen | |
| 2008/0267416 A1 | 10/2008 | Goldstein | |
| 2010/0020991 A1* | 1/2010 | Chen ................... | H04R 19/005 381/162 |
| 2011/0013300 A1* | 1/2011 | Wu ..................... | G02B 26/0858 359/849 |
| 2011/0051985 A1 | 3/2011 | Hwang | |
| 2011/0103616 A1 | 5/2011 | Kwon | |
| 2011/0181150 A1 | 7/2011 | Mahameed | |
| 2012/0053393 A1* | 3/2012 | Kaltenbacher ....... | H04R 25/606 29/25.35 |
| 2012/0082335 A1 | 4/2012 | Duisters | |
| 2013/0121509 A1 | 5/2013 | Hsu | |
| 2013/0223023 A1 | 8/2013 | Dehe | |
| 2014/0140558 A1 | 5/2014 | Kwong | |
| 2015/0163599 A1 | 6/2015 | Shim | |
| 2015/0204940 A1 | 7/2015 | Teeter | |
| 2015/0237438 A1 | 8/2015 | Lee | |
| 2016/0176704 A1 | 6/2016 | Cargill | |
| 2016/0381464 A1 | 12/2016 | Elyada | |
| 2017/0011600 A1 | 1/2017 | Joung | |
| 2017/0021391 A1 | 1/2017 | Guedes | |
| 2017/0040012 A1 | 2/2017 | Goldstein | |
| 2017/0041708 A1 | 2/2017 | Barzen | |
| 2017/0164115 A1 | 6/2017 | van Halteren | |
| 2017/0201192 A1* | 7/2017 | Tumpold ................. | H04R 7/06 |
| 2017/0217761 A1 | 8/2017 | Chung | |
| 2017/0260044 A1 | 9/2017 | Cargill | |
| 2017/0325030 A1 | 11/2017 | Stoppel | |
| 2018/0002168 A1 | 1/2018 | Cargill | |
| 2018/0020194 A1 | 1/2018 | Kim | |
| 2018/0120938 A1 | 5/2018 | Frescas | |
| 2019/0039880 A1 | 2/2019 | Paci | |
| 2019/0098390 A1 | 3/2019 | Carino | |
| 2019/0181776 A1 | 6/2019 | Tumpold | |
| 2019/0208343 A1 | 7/2019 | Monti | |
| 2019/0215620 A1 | 7/2019 | Albahri | |
| 2019/0349665 A1 | 11/2019 | Grinker | |
| 2020/0100033 A1 | 3/2020 | Stoppel | |
| 2020/0178000 A1 | 6/2020 | Niekiel | |
| 2020/0178003 A1 | 6/2020 | Zurbruegg | |
| 2020/0193973 A1 | 6/2020 | Tolomei | |
| 2020/0196067 A1 | 6/2020 | Rusconi Clerici Beltrami | |
| 2020/0211521 A1 | 7/2020 | Voss | |
| 2020/0213770 A1* | 7/2020 | Duan ..................... | H04R 17/02 |
| 2020/0244275 A1 | 7/2020 | Marzin | |
| 2020/0352788 A1 | 11/2020 | Van 'T Hof | |
| 2021/0281940 A1* | 9/2021 | Zhao ..................... | H04R 17/00 |
| 2022/0014836 A1 | 1/2022 | Liang | |
| 2022/0225031 A1 | 7/2022 | Liang | |

FOREIGN PATENT DOCUMENTS

| | | |
|---|---|---|
| CN | 105009604 A | 10/2015 |
| CN | 106937193 A | 7/2017 |
| CN | 107223346 A | 9/2017 |
| CN | 108702575 A | 10/2018 |
| CN | 110022506 A | 7/2019 |
| CN | 209402687 U | 9/2019 |
| CN | 111063790 A | 4/2020 |
| EP | 3 896 990 A1 | 10/2021 |
| JP | 11-307441 A | 11/1999 |
| JP | 2009-512375 A | 3/2009 |
| JP | 2012-249184 A | 12/2012 |
| JP | 2016-51915 A | 4/2016 |
| JP | 2017-112531 A | 6/2017 |
| JP | 2020-31444 A | 2/2020 |
| JP | 2022-16392 A | 1/2022 |
| KR | 10-2010-0002351 A | 1/2010 |
| KR | 10-2012-0034085 A | 4/2012 |
| KR | 10-2015-0030691 A | 3/2015 |
| KR | 10-2015-0097292 A | 8/2015 |
| KR | 10-2017-0139320 A | 12/2017 |
| KR | 10-2022-0007717 A | 1/2022 |
| KR | 10-2022-0103042 A | 7/2022 |
| TW | 1650025 B | 2/2019 |
| TW | 202203662 A | 1/2022 |
| WO | 2019/177324 A1 | 9/2019 |
| WO | 2021/202023 A1 | 10/2021 |

OTHER PUBLICATIONS

Hyonse Kim et al., A slim type microvalve driven by PZT films, Sensors and Actuators A: Physical, Jan. 18, 2005, pp. 162-171, vol. 121, Elsevier B. V., XP027806904.

Shen Guohao et al., Structure optimization design for capacitive silicon-based MEMS microphone, Semiconductor Devices, vol. 43, No. 12, p. 912-917, China Academic Journal Electronic Publishing House. ,Dec. 3, 2018.

Hua Qing et al., Acoustoeletric model of piezoelectric microphone with package structure, Transducer and Microsystem Technologies, 2018 vol. 37, No. 11, p. 42-44, China Academic Journal Electronic Publishing House. ,Nov. 30, 2018.

Chen Guidong et al., Highly sensitive MEMS humidity sensor based on candle-soot nanoparticle layer , Micronanoelectronic Technology, vol. 57, No. 1, p. 36-40, p. 48, China Academic Journal Electronic Publishing House ,Jan. 2020.

Wang Zhicheng, Stylish structure and innovative features of new generation speakers, Household Electric Appliances, Issue 12, 2003, p. 38-40, China Academic Journal Electronic Publishing House ,2003.

Zhou Xiao-wei et al., Preliminary evaluation of predicative performance of BAHA softband in the conductive or mixed hearing loss patients, Journal of Otolaryngology and Ophthalmology of Shandong University, vol. 29, Issue No. 2, 2015, p. 28-30, China Academic Journal Electronic Publishing House. ,Apr. 16, 2015.

Stefan Liebich et al., active occlusion cancellation with hear-through equalization for headphones, Institute of Communication

(56) References Cited

OTHER PUBLICATIONS

Systems, 2018 IEEE international conference on acoustics, speech and signal processing. Canada ,Apr. 2018.

* cited by examiner

VENTING DEVICE, MANUFACTURING METHOD OF VENTING DEVICE, VENTING METHOD AND DEVICE

CROSS REFERENCE TO RELATED APPLICATIONS

This application is a continuation-in-part of U.S. application Ser. No. 17/955,562, filed on Sep. 29, 2022, which is a division of U.S. application Ser. No. 17/842,810, filed on Jun. 17, 2022, which is a continuation-in-part of U.S. application Ser. No. 17/344,980, filed on Jun. 11, 2021, which claims the benefit of U.S. Provisional Application No. 63/050,763, filed on Jul. 11, 2020, and claims the benefit of U.S. Provisional Application No. 63/051,885, filed on Jul. 14, 2020, and claims the benefit of U.S. Provisional Application No. 63/171,919, filed on Apr. 7, 2021. Besides, U.S. application Ser. No. 17/842,810 claims the benefit of U.S. Provisional Application No. 63/320,703, filed on Mar. 17, 2022. Further, this application claims the benefit of U.S. Provisional Application No. 63/468,277, filed on May 23, 2023. The contents of these applications are incorporated herein by reference.

BACKGROUND OF THE INVENTION

1. Field of the Invention

The present invention relates to a venting device, a manufacturing method of a venting device, a venting method and a device, and more particularly, to a venting device capable of eliminating an occlusion effect, to a related manufacturing method, to a related venting method and to a related device.

2. Description of the Prior Art

Nowadays, wearable sound devices, such as in-ear (insert into ear canal) earbuds, on-ear or over-ear earphones, etc. are generally used for producing sound or receiving sound. Magnet and moving coil (MMC) based microspeaker have been developed for decades and widely used in many such devices. Recently, MEMS (Micro Electro Mechanical System) acoustic transducers which make use of a semiconductor fabrication process can be sound producing/receiving components in the wearable sound devices.

Occlusion effect is due to the sealed volume of ear canal causing loud perceived sound pressure by the listener. For example, the occlusion effect occurs while the listener does specific motion(s) generating a bone-conducted sound (such as walking, jogging, talking, eating, touching the acoustic transducer, etc.) and uses the wearable sound device (e.g., the wearable sound device is filled in his/her ear canal). The occlusion effect is particularly strong toward bass due to the difference of acceleration based SPL (sound pressure level) generation ($SPL \propto a = dD^2/dt^2$) and compression based SPL generation ($SPL \propto D$). For instance, a displacement of merely 1 μm at 20 Hz will cause a SPL=1 μm/25 mm atm=106 dB in occluded ear canal (25 mm is average length of adult ear canals). Therefore, if the occlusion effect occurs, listener hears the occlusion noise, and the quality of listener experience is bad.

In the traditional technology, the wearable sound device has an airflow channel existing between the ear canal and the ambient external to the device, such that the pressure caused by the occlusion effect can be released from this airflow channel to suppress the occlusion effect. However, because the airflow channel always exists, in the frequency response, the SPL in the lower frequency (e.g., lower than 500 Hz) has a significant drop. For example, if the traditional wearable sound device uses a typical 115 dB speaker driver, the SPL in 20 Hz is much lower than 110 dB. In addition, if a size of a fixed vent configured to form the airflow channel is greater, the SPL drop will be greater, and the water and dust protection will become more difficult.

In some cases, the traditional wearable sound device may use a speaker driver stronger than the typical 115 dB speaker driver to compensate for the loss of SPL in lower frequency due to the existence of the airflow channel. For example, assuming the loss of SPL is 20 dB, then the required speaker driver to maintain the same 115 dB SPL in the presence of the airflow channel will be 135 dB SPL, were it to be used in a sealed ear canal. However, the 10× stronger bass output requires the speaker membrane travel to also increase by 10× which implies the heights of both the coil and the magnet flux gap of the speaker driver need to be increased by 10×. Thus, it is difficult to make the traditional wearable sound device having the strong speaker driver have the small size and light weight.

Therefore, it is necessary to improve the prior art, so as to suppress the occlusion effect.

SUMMARY OF THE INVENTION

It is therefore a primary objective of the present invention to provide a venting device capable of suppressing an occlusion effect. The manufacturing method of this venting device, the related venting method and the related device are also provided.

An embodiment of the present invention provides a venting device including an anchor structure and a membrane. The membrane is anchored on the anchor structure and configured to form a first vent and a second vent. The membrane includes a first flap, a second flap and a third flap. The membrane partitions a space into a first volume and a second volume, and the first volume and the second volume are connected when the first vent and the second vent are formed. The first flap is actuated to move toward a first direction and the second flap is actuated to move toward a second direction opposite to the first direction, so as to form the first vent. The first flap is actuated to move toward the first direction and the third flap is actuated to move toward the second direction opposite to the first direction, so as to form the second vent.

An embodiment of the present invention provides a device including an anchor structure and a membrane. The membrane is anchored on the anchor structure and configured to form a vent. The membrane partitions a space into a first volume and a second volume, and the first volume and the second volume are connected via the vent when the vent is formed. A slit is formed on the membrane and the vent is formed because of the slit. A segment of the slit zigzags on the membrane.

An embodiment of the present invention provides a manufacturing method of a venting device. The manufacturing method includes: providing a wafer including a first layer and a second layer, wherein the first layer includes a membrane; and patterning the first layer of the wafer to form a plurality of slits, such that the membrane includes a first flap, a second flap and a third flap separated from each other by the slits. The membrane is configured to be controlled to form a plurality vents because of the plurality of slits. The slits include a first slit and a second slit, and the vents include a first vent and a second vent. The first slit is formed between the first flap and the second flap, and the second slit is formed between the first flap and the third flap.

An embodiment of the present invention provides a venting method related to above venting device. The venting method includes: actuating the first flap toward a first direction; and actuating the second flap and the third flap toward a second direction opposite to the first direction. The first vent is formed between the first flap and the second flap because of the first slit, and the second vent is formed between the first flap and the third flap because of the second slit.

An embodiment of the present invention provides a manufacturing method of a venting device. The manufacturing method includes: providing a wafer including a first layer and a second layer, wherein the first layer includes a membrane; and patterning the first layer of the wafer to form a zigzagging slit, wherein the zigzagging slit zigzags on the membrane and extends toward a direction, and the membrane includes a first flap and a second flap separated from each other by the zigzagging slit. The membrane is configured to be controlled to form a vent, and the vent is formed because of the zigzagging slit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
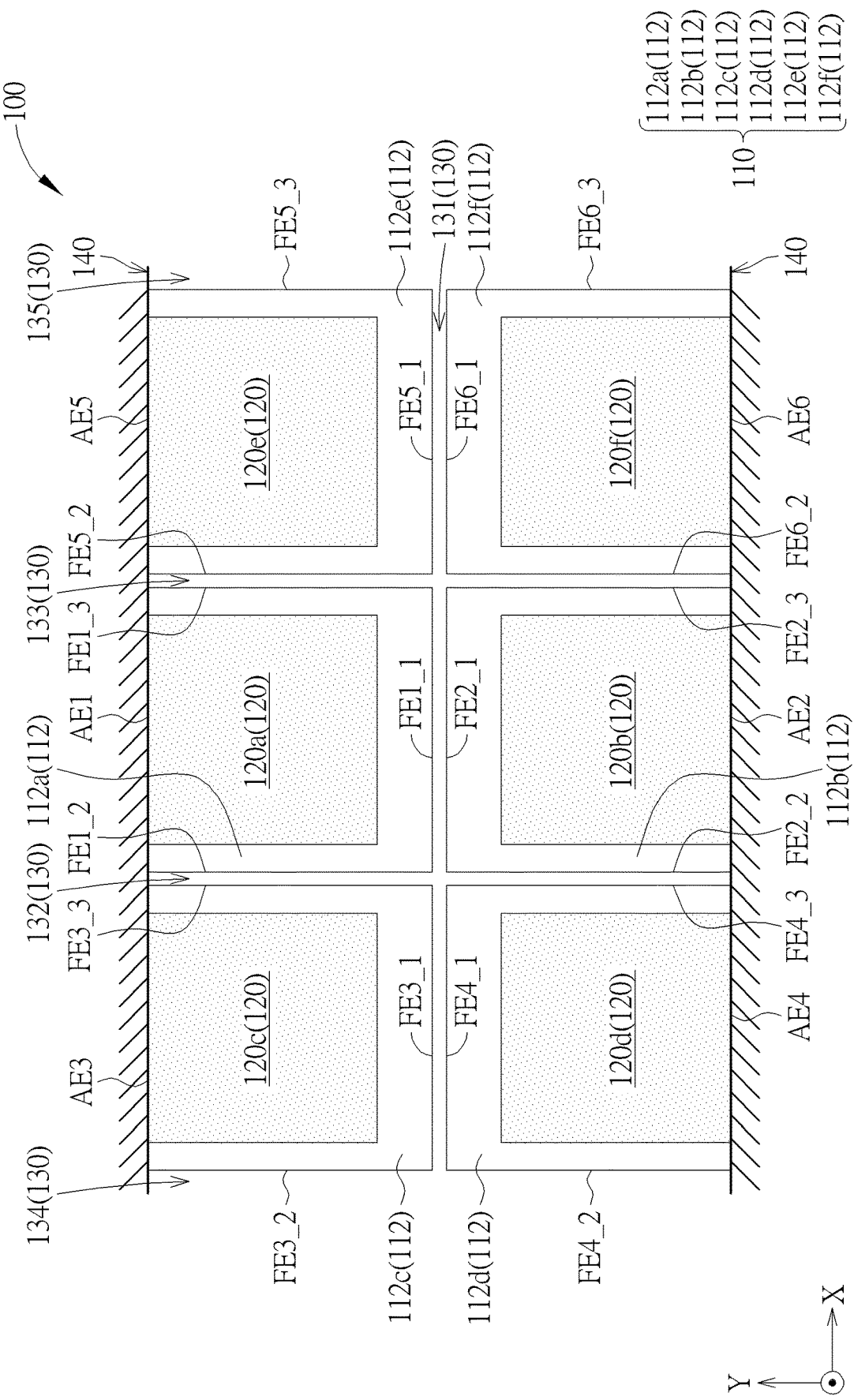
FIG. 1 is a schematic diagram of a top view illustrating a venting device according to a first embodiment of the present invention.

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

In the following description and in the claims, when "a A1 component is formed by/of B1", B1 exist in the formation of A1 component or B1 is used in the formation of A1 component, and the existence and use of one or a plurality of other features, areas, steps, operations and/or components are not excluded in the formation of A1 component.

In the following description and in the claims, the term "substantially" generally means a small deviation may exist or not exist. For instance, the terms "substantially parallel"

and "substantially along" means that an angle between two components may be less than or equal to a certain degree threshold, e.g., 10 degrees, 5 degrees, 3 degrees or 1 degree. For instance, the term "substantially aligned" means that a deviation between two components may be less than or equal to a certain difference threshold, e.g., 2 μm or 1 μm. For instance, the term "substantially the same" means that a deviation is within, e.g., 10% of a given value or range, or mean within 5%, 3%, 2%, 1%, or 0.5% of a given value or range.

In the description and following claims, the term "horizontal direction" generally means a direction parallel to a horizontal plane, the term "horizontal plane" generally means a surface parallel to a direction X and a direction Y in the drawings (i.e., the direction X and the direction Y of the present invention may be considered as the horizontal directions), the term "vertical direction" and the term "top-view direction" generally mean a direction parallel to a direction Z and perpendicular to the horizontal direction in the drawings, and the direction X, the direction Y and the direction Z are perpendicular to each other. In the description and following claims, the term "top view" generally means a viewing result viewing along the vertical direction. In the description and following claims, the term "side view" generally means a viewing result viewing along the horizontal direction. In the description and following claims, the term "cross-sectional view" generally means a viewing result viewing a structure cutting along the vertical direction along the horizontal direction.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention.

In the present invention, a venting device (or a MEMS venting device) capable of suppressing an occlusion effect may be related to an acoustic apparatus and/or disposed within an acoustic apparatus (such as a wearable sound device). For instance, the venting device may be disposed within the wearable sound device (e.g., an in-ear device), but not limited thereto.

In the present invention, the acoustic apparatus may include an acoustic transducer configured to perform an acoustic transformation, wherein the acoustic transformation may convert signals (e.g. electric signals or signals with other suitable type) into an acoustic wave, or may convert an acoustic wave into signals with other suitable type (e.g. electric signals). In some embodiments, the acoustic transducer may be a sound producing device, a speaker, a micro speaker or other suitable device, so as to convert the electric signals into the acoustic wave, but not limited thereto. In some embodiments, the acoustic transducer may be a sound measuring device, a microphone or other suitable device, so as to convert the acoustic wave into the electric signals, but not limited thereto. Owing to the existence of the venting device of the present invention, the occlusion effect would be suppressed, so as to make the user have a good experience of the acoustic transformation provided by the acoustic apparatus.

In the following, the venting device of the present invention may be related to and disposed in the wearable sound device configured to produce the acoustic wave. For example, the wearable sound device may be an earbud or a hearing aid. The following explanation is configured to make those skilled in the art better understand the present invention.

In order to mitigate occlusion noise, U.S. Pat. No. 11,323,797 discloses an acoustic transducer or a venting device comprising a first flap and a second flap configured to form a vent, to balance pressure of two volumes separated by the flaps. In order to improve pressure balance (relief) efficiency, acoustic resistance corresponding to the vent shall be as small as possible. A trivial approach to reduce acoustic resistance is either to increase dimension of the two flaps (e.g., increasing length or width of flap, via membrane design) or to enlarge vent opening (via increasing flap displacement in open mode). Increasing flap dimension may yield a large size of venting device; while enlarging vent opening may bring severe notch effect within sensitive audio band (e.g., 1K~10K Hz) due to strong mechanical-acoustic coupling. Effects brought by the approaches stated in the above are undesirable.

In the present invention, venting device with reduced acoustic resistance (beyond simply increasing flap dimension/displacement) is disclosed.

Specifically, in addition to first flap and second flap between which a first vent is formed, the venting device comprises a third flap to enlarge vent opening of a second vent formed between the first and third flaps, so as to reduce acoustic resistance. Furthermore, instead of straight-line slit (slit formed as straight line), slit on the membrane may be formed in a zigzagging pattern, so as to reduce acoustic resistance.

Figure 2:
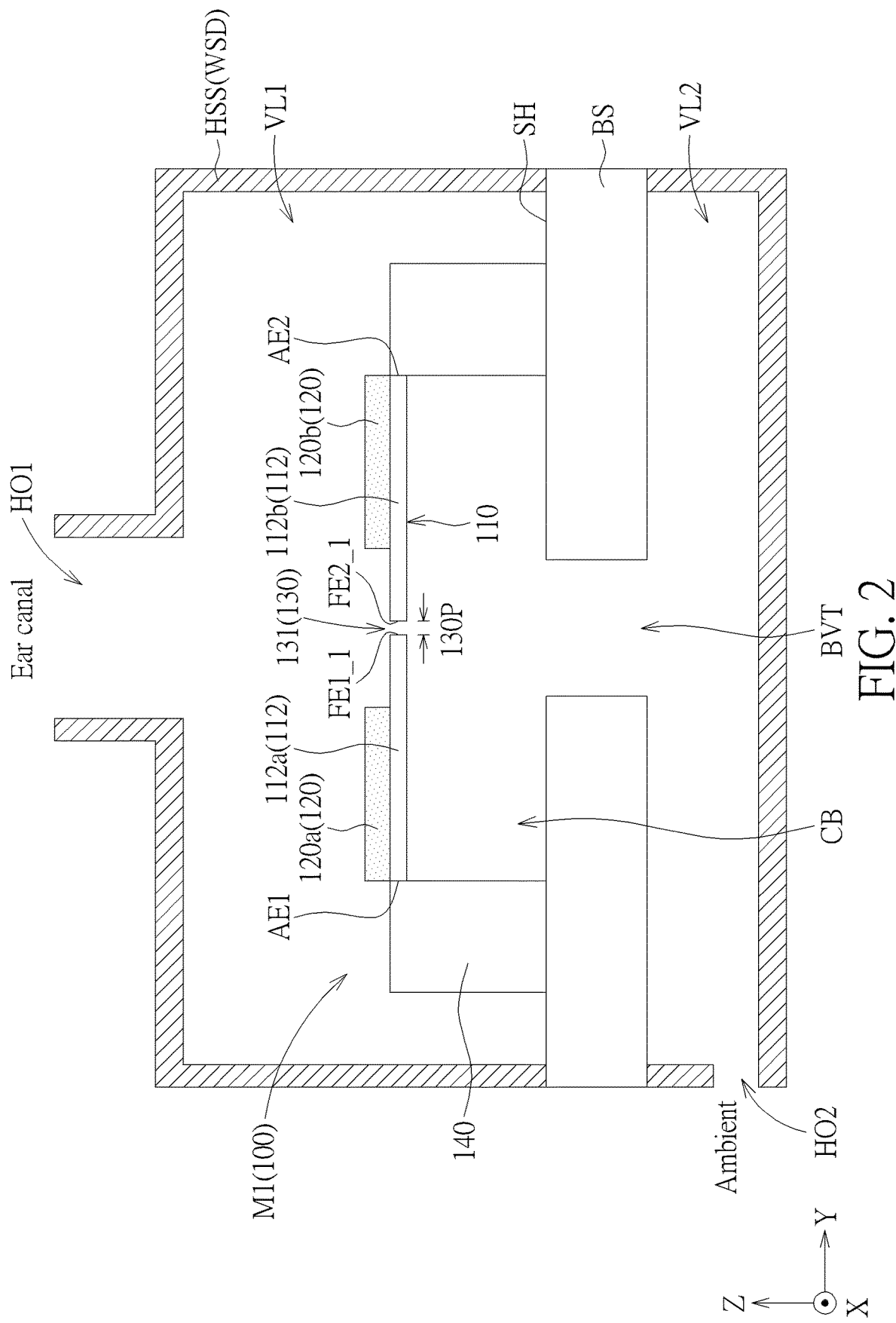
FIG. 2 is a schematic diagram of a cross sectional view illustrating a venting device and a housing structure according to the first embodiment of the present invention.

Referring to FIG. 1 and FIG. 2, FIG. 1 is a schematic diagram of a top view illustrating a venting device according to a first embodiment of the present invention, and FIG. 2 is a schematic diagram of a cross sectional view illustrating a venting device and a housing structure according to the first embodiment of the present invention. As shown in FIG. 1 and FIG. 2, the venting device 100 may be disposed on a base BS. The base BS may be hard or flexible, wherein the base BS may include silicon, germanium, glass, plastic, quartz, sapphire, metal, polymer (e.g., polyimide (PI), polyethylene terephthalate (PET)), any other suitable material or a combination thereof. As an example, the base BS may be a circuit board including a laminate (e.g., copper clad laminate, CCL), a land grid array (LGA) board or any other suitable board containing conductive material, but not limited thereto. In some embodiments, the base BS may be a substrate.

In FIG. 2, the base BS has a top surface SH parallel to the direction X and the direction Y (i.e., the top surface SH of the base BS is a horizontal plane). In FIG. 2, a normal direction of the top surface SH of the base BS is parallel to the direction Z.

Figure 5:
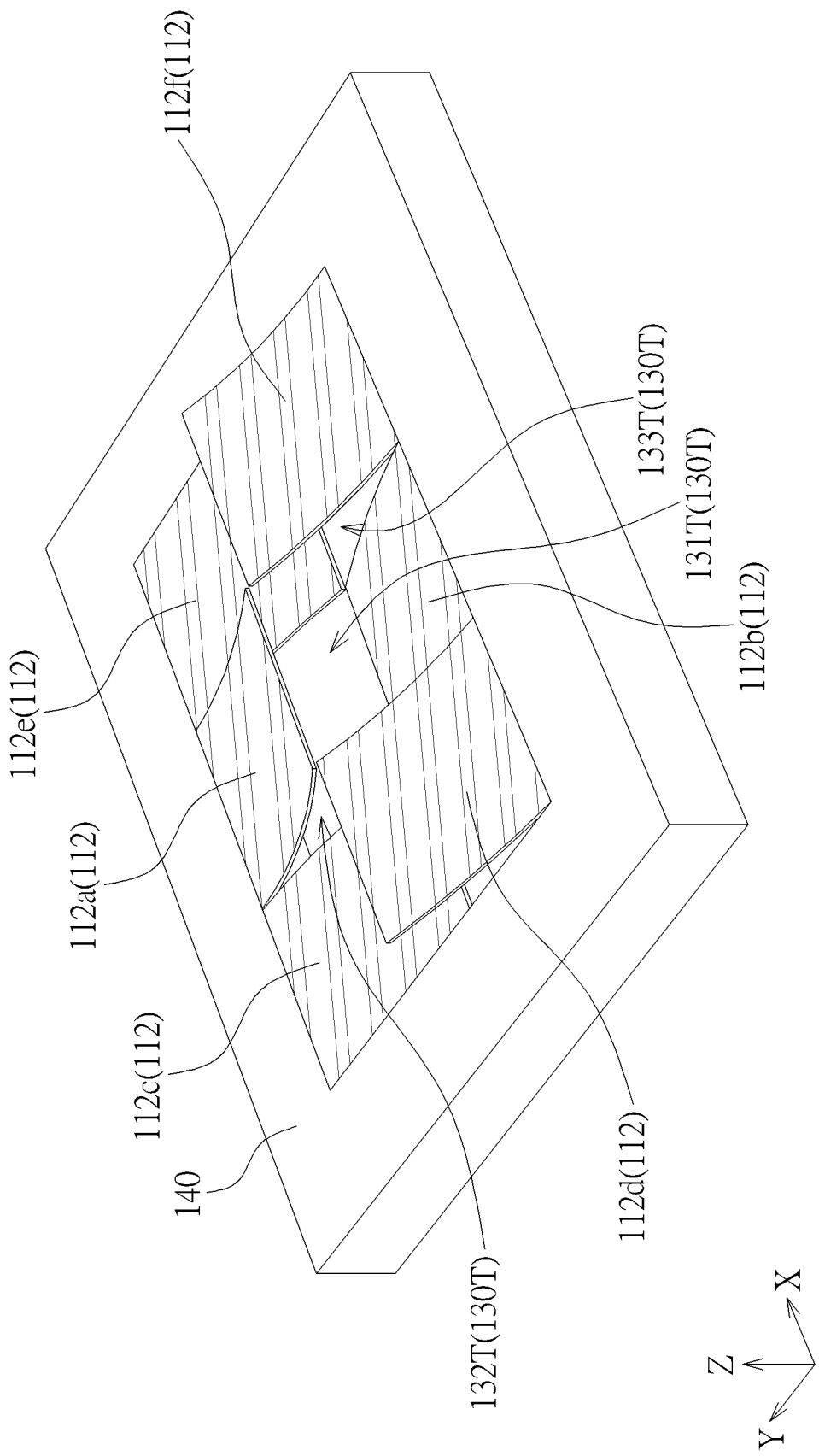
FIG. 5 is a schematic diagram illustrating a venting device in a second mode according to the first embodiment of the present invention.

The venting device 100 includes at least one anchor structure 140 and a membrane 110 anchored by/on the anchor structure 140, wherein the anchor structure 140 may be disposed outside the membrane 110 (e.g., in FIG. 5, the anchor structure 140 may surround the membrane 110). The membrane 110 and the anchor structure 140 may include any suitable material(s). In some embodiments, the membrane 110 and the anchor structure 140 may individually include silicon (e.g., single crystalline silicon or poly-crystalline silicon), silicon compound (e.g., silicon carbide, silicon oxide), germanium, germanium compound, gallium, gallium compound (e.g., gallium nitride or gallium arsenide), other suitable material or a combination thereof, but not limited thereto. In some embodiments, the membrane 110 and the anchor structure 140 may have the same material.

In the operation of the venting device 100, the membrane 110 may be actuated to have a movement, and the anchor structure 140 may be immobilized. Namely, the anchor structure 140 may be a fixed end (or fixed edge) respecting the membrane 110 during the operation of the venting device 100. In some embodiments, the membrane 110 may be actuated to move upwards and downwards, but not limited thereto. In the present invention, the terms "move upwards" and "move downwards" represent that the membrane 110 moves substantially along the direction Z. Moreover, "upwards" may refer to the direction Z (i.e., +Z direction) while "downwards" may refer to a direction opposite to the direction Z (i.e., –Z direction).

As shown in FIG. 1 and FIG. 2, the membrane 110 of the venting device 100 includes at least one slit 130, and the membrane 110 may be divided into a plurality of flaps 112 by the slit(s) 130, wherein the flaps 112 are separated from each other by the slit(s) 130, and the number of the flaps 112 may be designed based on requirement(s). For example, as shown in FIG. 1 and FIG. 2, the membrane 110 may be divided into a first flap 112a, a second flap 112b, a third flap 112c, a fourth flap 112d, a fifth flap 112e and a sixth flap 112f by the slits 130. Note that each slit 130 may be a boundary of the membrane 110 and/or a boundary of the flap 112.

In the present invention, an arrangement of the flaps 112 may be designed based on requirement(s). In FIG. 1, the flaps 112 may be arranged in an array (e.g., the 3×2 array), but not limited thereto. In FIG. 1, the first flap 112a may be adjacent to the second flap 112b in the direction Y, the third flap 112c may be adjacent to the fourth flap 112d in the direction Y, the fifth flap 112e may be adjacent to the sixth flap 112f in the direction Y, the first flap 112a may be adjacent to the third flap 112c and the fifth flap 112e in the direction X (i.e., the first flap 112a may be between the third flap 112c and the fifth flap 112e in the direction X), and the second flap 112b may be adjacent to the fourth flap 112d and the sixth flap 112f in the direction X, but not limited thereto.

The flaps 112 of the membrane 110 has at least one anchor edge (or anchor end) anchored on the anchor structure 140 and at least one free edge (or free end) which is not permanently anchored on any component within the venting device 100, and the anchor edge(s) and the free edge(s) of each flap 112 may be designed based on requirement(s). For instance, in each flap 112 shown in FIG. 1 and FIG. 2, the flap 112 may have one anchor edge, and edges of the flap 112 other than the anchor edge are non-anchored to serve as free edges, but not limited thereto. In FIG. 1 and FIG. 2, the first flap 112a may have a first anchor edge AE1 anchored on the anchor structure 140, the second flap 112b may have a second anchor edge AE2 anchored on the anchor structure 140, the third flap 112c may have a third anchor edge AE3 anchored on the anchor structure 140, the fourth flap 112d may have a fourth anchor edge AE4 anchored on the anchor structure 140, the fifth flap 112e may have a fifth anchor edge AE5 anchored on the anchor structure 140, the sixth flap 112f may have a sixth anchor edge AE6 anchored on the anchor structure 140, and edges of these flaps 112 other than the first anchor edge AE1, the second anchor edge AE2, the third anchor edge AE3, the fourth anchor edge AE4, the fifth anchor edge AE5 and the sixth anchor edge AE6 are free edges, but not limited thereto.

In FIG. 1, the first flap 112a, the third flap 112c and the fifth flap 112e may be anchored on the same side, the second flap 112b, the fourth flap 112d and the sixth flap 112f may be anchored on the same side, such that the first flap 112a, the third flap 112c and the fifth flap 112e may be respectively opposite to the second flap 112b, the fourth flap 112d and the sixth flap 112f in the direction Y, but not limited thereto. In FIG. 1, the first anchor edge AE1, the second anchor edge AE2, the third anchor edge AE3, the fourth anchor edge AE4, the fifth anchor edge AE5 and sixth anchor edge AE6 may be parallel to the same direction (e.g., the direction X), but not limited thereto.

In the present invention, a shape of the flap 112 may be designed based on requirement(s). The shape of the flap 112 may be a polygon (e.g., a rectangle), a shape having a curved edge (e.g., a circle, an oval) or other suitable shape. For instance, in FIG. 1, each flap 112 may be in a shape of rectangle, such that each flap 112 includes one anchor edge and three free edges, but not limited thereto.

In the first flap 112a, a free edge FE1_1 is opposite to the first anchor edge AE1 in the direction Y, and a free edge FE1_2 and a free edge FE1_3 are opposite to each other in the direction X and between the free edge FE1_1 and the first anchor edge AE1. In the second flap 112b, a free edge FE2_1 is opposite to the second anchor edge AE2 in the direction Y, and a free edge FE2_2 and a free edge FE2_3 are opposite to each other in the direction X and between the free edge FE2_1 and the second anchor edge AE2. In the third flap 112c, a free edge FE3_1 is opposite to the third anchor edge AE3 in the direction Y, and a free edge FE3_2 and a free edge FE3_3 are opposite to each other in the direction X and between the free edge FE3_1 and the third anchor edge AE3. In the fourth flap 112d, a free edge FE4_1 is opposite to the fourth anchor edge AE4 in the direction Y, and a free edge FE4_2 and a free edge FE4_3 are opposite to each other in the direction X and between the free edge FE4_1 and the fourth anchor edge AE4. In the fifth flap 112e, a free edge FE5_1 is opposite to the fifth anchor edge AE5 in the direction Y, and a free edge FE5_2 and a free edge FE5_3 are opposite to each other in the direction X and between the free edge FE5_1 and the fifth anchor edge AE5. In the sixth flap 112f, a free edge FE6_1 is opposite to the sixth anchor edge AE6 in the direction Y, and a free edge FE6_2 and a free edge FE6_3 are opposite to each other in the direction X and between the free edge FE6_1 and the sixth anchor edge AE6.

In the present invention, the number of the slit(s) 130 included in the membrane 110 may be adjusted based on requirement(s), and the slit(s) 130 may be disposed at any suitable position of the membrane 110 and have any suitable top-view pattern. For example, the slit 130 may be a straight slit, a curved slit, a combination of straight slits, a combination of curved slits or a combination of straight slit(s) and curved slit(s).

In FIG. 1, the slits 130 include a first slit 131, a second slit 132 and a third slit 133, wherein the first slit 131 is formed between the first flap 112a and the second flap 112b, between the third flap 112c and the fourth flap 112d and between the fifth flap 112e and the sixth flap 112f, the second slit 132 is formed between the first flap 112a and the third flap 112c and between the second flap 112b and the fourth flap 112d, and the third slit 133 is formed between the first flap 112a and the fifth flap 112e and between the second flap 112b and the sixth flap 112f. In FIG. 1, the slits 130 may optionally include a fourth slit 134 and a fifth slit 135, wherein the fourth slit 134 and the fifth slit 135 are formed around the membrane 110 to define the boundaries of the membrane 110 (e.g., the fourth slit 134 and the fifth slit 135 are formed between the membrane 110 and the anchor structure 140 shown in FIG. 5). As shown in FIG. 1, the third flap 112c and the fourth flap 112d may be between the second slit 132 and the fourth slit 134, and the fifth flap 112e and the sixth flap 112f may be between the third slit 133 and the fifth slit 135. The first slit 131 may extend along the direction X, and the second slit 132, the third slit 133, the fourth slit 134 and the fifth slit 135 may extend along the direction Y, but not limited thereto.

In FIG. 1, these slits 130 define some free edges of the flaps 112. The first slit 131 may define the free edge FE1_1 of the first flap 112a, the free edge FE2_1 of the second flap 112b, the free edge FE3_1 of the third flap 112c, the free edge FE4_1 of the fourth flap 112d, the free edge FE5_1 of the fifth flap 112e and the free edge FE6_1 of the sixth flap 112f. The second slit 132 may define the free edge FE1_2 of the first flap 112a, the free edge FE2_2 of the second flap 112b, the free edge FE3_3 of the third flap 112c and the free edge FE4_3 of the fourth flap 112d. The third slit 133 may define the free edge FE1_3 of the first flap 112a, the free edge FE2_3 of the second flap 112b, the free edge FE5_2 of the fifth flap 112e and the free edge FE6_2 of the sixth flap 112f. The fourth slit 134 may define the free edge FE3_2 of the third flap 112c and the free edge FE4_2 of the fourth flap 112d. The fifth slit 135 may define the free edge FE5_3 of the fifth flap 112e and the free edge FE6_3 of the sixth flap 112f.

Thus, according to the arrangement of the flaps 112 and the arrangement of the slits 130, in FIG. 1, the free edges FE1_1, FE1_2 and FE1_3 of the first flap 112a may be respectively adjacent to the second flap 112b, the third flap 112c and the fifth flap 112e, the free edges FE2_1, FE2_2 and FE2_3 of the second flap 112b may be respectively adjacent to the first flap 112a, the fourth flap 112d and the sixth flap 112f, the free edges FE3_1 and FE3_3 of the third flap 112c may be respectively adjacent to the fourth flap 112d and the first flap 112a, the free edges FE4_1 and FE4_3 of the fourth flap 112d may be respectively adjacent to the third flap 112c and the second flap 112b, the free edges FE5_1 and FE5_2 of the fifth flap 112e may be respectively adjacent to the sixth flap 112f and the first flap 112a, and the free edges FE6_1 and FE6_2 of the sixth flap 112f may be respectively adjacent to the fifth flap 112e and the second flap 112b, but not limited thereto.

The venting device 100 includes an actuator 120 disposed on the membrane 110 and configured to actuate the membrane 110. For instance, in FIG. 1 and FIG. 2, the actuator 120 may be in contact with the membrane 110, but not limited thereto. As shown in FIG. 1 and FIG. 2, the actuator 120 may not totally overlap the membrane 110 in the direction Z, but not limited thereto.

As shown in FIG. 1 and FIG. 2, the actuator 120 may include a plurality of actuating portions disposed on the plurality of flaps 112 of the membrane 110. For instance (as shown in FIG. 1), the actuator 120 includes a first actuating portion 120a disposed on the first flap 112a, a second actuating portion 120b disposed on the second flap 112b, a third actuating portion 120c disposed on the third flap 112c, a fourth actuating portion 120d disposed on the fourth flap 112d, a fifth actuating portion 120e disposed on the fifth flap 112e and a sixth actuating portion 120f disposed on the sixth flap 112f.

The actuator 120 has a monotonic electromechanical converting function with respect to the movement of the membrane 110 along the direction Z. In some embodiments, the actuator 120 may include a piezoelectric actuator, an electrostatic actuator, a nanoscopic-electrostatic-drive (NED) actuator, an electromagnetic actuator or any other suitable actuator, but not limited thereto. For example, in an embodiment, the actuator 120 may include a piezoelectric actuator, the piezoelectric actuator may contain such as two electrodes and a piezoelectric material layer (e.g., lead zirconate titanate, PZT) disposed between the electrodes, wherein the piezoelectric material layer may actuate the membrane 110 based on driving signals (e.g., driving voltages and/or driving voltage difference between two electrodes) received by the electrodes, but not limited thereto. For example, in another embodiment, the actuator 120 may include an electromagnetic actuator (such as a planar coil), wherein the electromagnetic actuator may actuate the membrane 110 based on a received driving signals (e.g., driving current) and a magnetic field (i.e. the membrane 110 may be actuated by the electromagnetic force), but not limited thereto. For example, in still another embodiment, the actuator 120 may include an electrostatic actuator (such as conducting plate) or a NED actuator, wherein the electrostatic actuator or the NED actuator may actuate the membrane 110 based on a received driving signals (e.g., driving voltage) and an electrostatic field (i.e. the membrane 110 may be actuated by the electrostatic force), but not limited thereto. In the following, the actuator 120 may be a piezoelectric actuator for example.

In this embodiment, the venting device 100 may optionally include a chip disposed on the top surface SH of the base BS, wherein the chip may include the membrane 110, the anchor structure 140 and the actuator 120 at least. The manufacturing method of the chip is not limited. For example, in this embodiment, the chip may be formed by at least one semiconductor process to be a MEMS chip, such that the membrane 110 is a MEMS structure, but not limited thereto.

In addition, as shown in FIG. 2, a chamber CB may exist between the base BS and the membrane 110. As shown in FIG. 2, the base BS may further include a back opening BVT, and the chamber CB may be connected to the rear outside of the venting device 100 (i.e., a space back of the base BS) through the back opening BVT.

As shown in FIG. 2, the venting device 100 and the base BS are disposed within a housing structure HSS inside the wearable sound device WSD. In FIG. 2, the housing structure HSS may have a first housing opening HO1 and a second housing opening HO2, wherein the first housing opening HO1 may be connected to an ear canal of a wearable sound device user, the second housing opening HO2 may be connected to an ambient of the wearable sound device WSD, and the membrane 110 is between the first housing opening HO1 and the second housing opening HO2. Note that the ambient of the wearable sound device WSD may not inside the ear canal (e.g., the ambient of the wearable sound device WSD may be directly connected to the space outside the ear). Furthermore, in FIG. 2, since the chamber CB may exist between the base BS and the membrane 110, the chamber CB may be connected to the ambient of the wearable sound device WSD through the back opening BVT of the base BS and the second housing opening HO2 of the housing structure HSS.

As shown in FIG. 2, the membrane 110 of the venting device 100 partitions a space formed within the housing structure HSS into a first volume VL1 to be connected to the ear canal of the wearable sound device user and a second volume VL2 to be connected to the ambient of the wearable sound device WSD. In FIG. 2, the first volume VL1 is connected to the first housing opening HO1 of the housing structure HSS, and the second volume VL2 is connected to the second housing opening HO2 of the housing structure HSS. Thus, the first volume VL1 is to be connected to the ear canal of the wearable sound device user through the first housing opening HO1, and the second volume VL2 is to be connected to the ambient of the wearable sound device WSD through the second housing opening HO2. As shown in FIG. 2, the chamber CB is a portion of the second volume VL2.

Note that, the housing structure HSS may be designed based on practical requirement and not limited to the one shown in FIG. 2. As long as the first volume VL1 and the second volume VL2 are connected when the vents 130T are formed, requirement of the present invention is satisfied.

Figure 6:
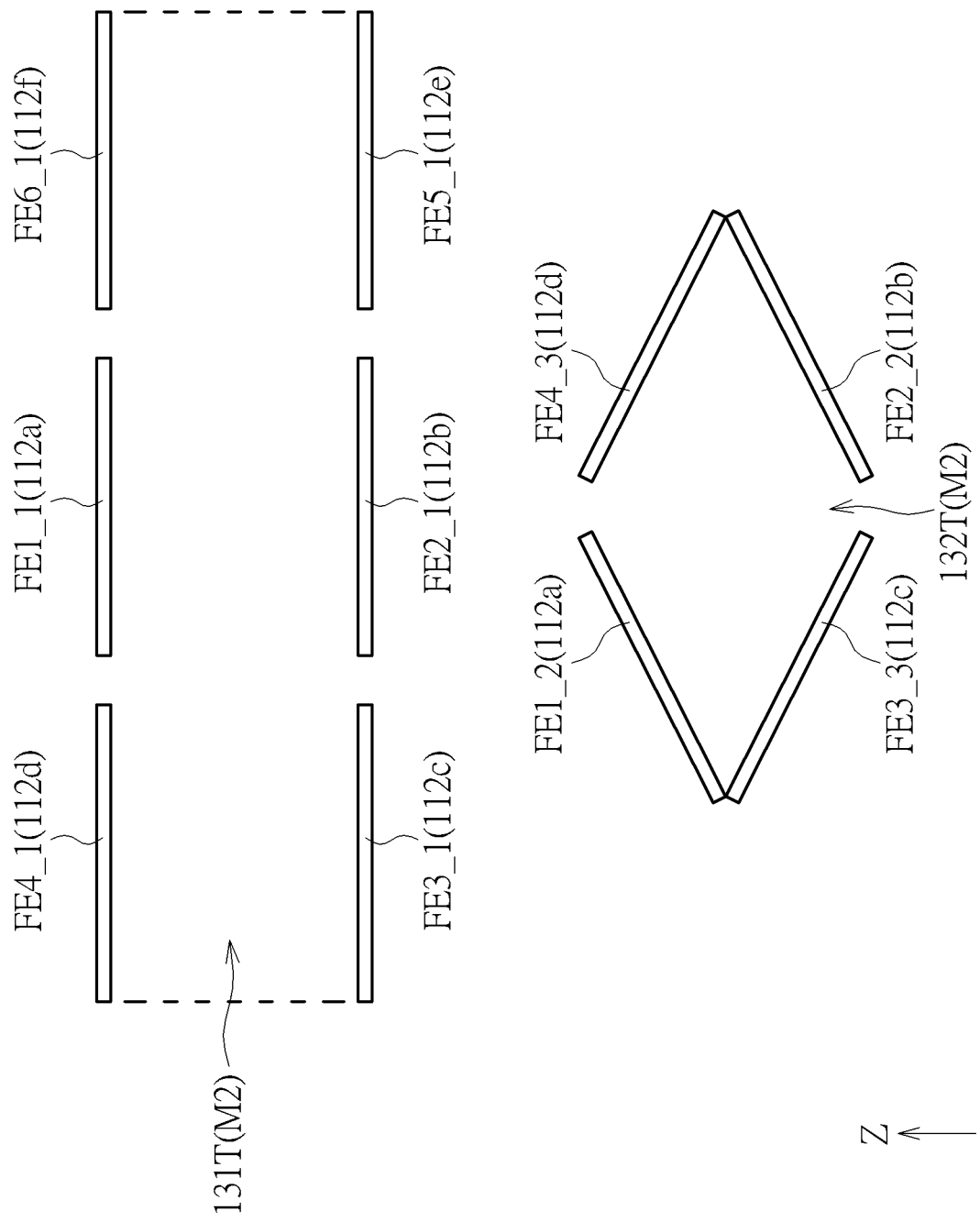
FIG. 6 is a schematic diagram illustrating side views of vents of a venting device in a second mode according to the first embodiment of the present invention.
Figure 7:
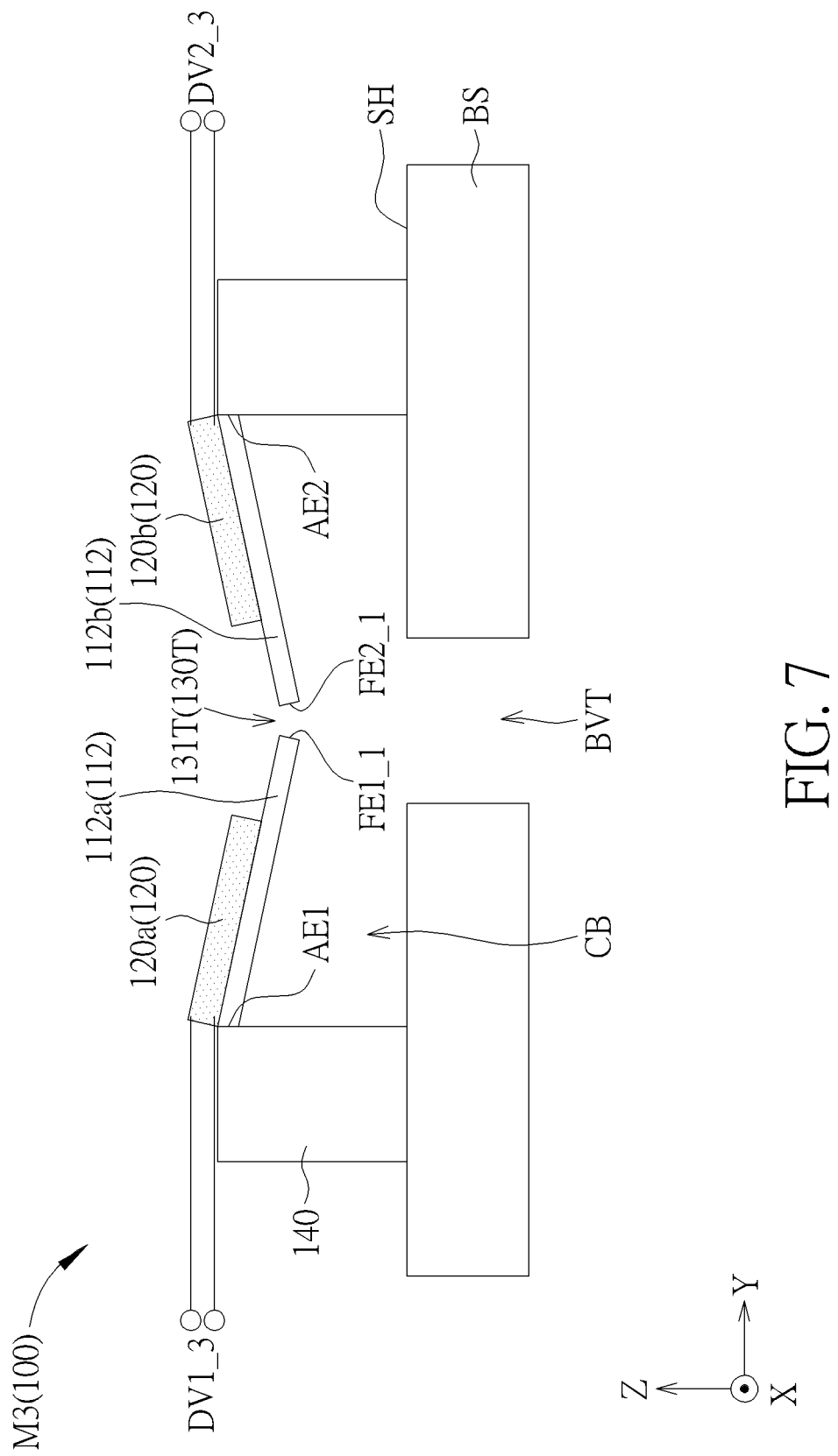
FIG. 7 is a schematic diagram of a cross sectional view illustrating a venting device in a third mode according to the first embodiment of the present invention.

The flaps 112 of the membrane 110 may be individually actuated to move upwards and downwards by the actuator 120. Further referring to FIG. 3 to FIG. 7, FIG. 3 is a schematic diagram of a cross sectional view illustrating a venting device in a first/close mode according to the first embodiment of the present invention, FIG. 4 is a schematic diagram of a cross sectional view illustrating a venting device in a second/open mode according to the first embodiment of the present invention, FIG. 5 is a schematic diagram illustrating a venting device in a second mode according to the first embodiment of the present invention, FIG. 6 is a schematic diagram illustrating side views of vents of a venting device in a second mode according to the first embodiment of the present invention, and FIG. 7 is a schematic diagram of a cross sectional view illustrating a venting device in a third/comfort mode according to the first embodiment of the present invention. In the flaps 112 shown in FIG. 1 to FIG. 7, the free edges FE1_1, FE2_1, FE3_1, FE4_1, FE5_1 and FE6_1 opposite to their corresponding anchor edges may be configured to perform up-and-down movements. Based on the requirement(s), the moving directions of the up-and-down movements of these free edges FE1_1, FE2_1, FE3_1, FE4_1, FE5_1 and FE6_1 may be the same or opposite, and the moving distances of the up-and-down movements of these free edges FE1_1, FE2_1, FE3_1, FE4_1, FE5_1 and FE6_1 may be the same or different.

As shown in FIG. 1 to FIG. 7, the membrane 110 (the flaps 112) may be actuated/controlled to move upwards and downwards by the actuator 120, such that a plurality of vents 130T related to the slits 130 are formed/opened or closed (i.e., the membrane 110 is configured to form/open or close the vents 130T), wherein each vent 130T is formed between opposite sidewalls of the slit 130 (i.e., the free edges defined by the slit 130). Namely, the vents 130T are formed because of (or on) the slits 130. In the present invention, each vent 130T is formed between two different flaps 112. In the condition "the vent 130T is closed/sealed", the air is hard to flow between the first volume VL1 and the second volume VL2 through a space between opposite sidewalls of the slit 130, meaning that acoustic resistance of the vent 130T is large or larger than a threshold. In the condition "the vent 130T is formed", the air easily flows between the first volume VL1 and the second volume VL2 through a space between two opposite sidewalls of the slit 130, meaning that acoustic resistance of the vent 130T is low or lower than another threshold.

In FIG. 1, the vents 130T include a first vent 131T, a second vent 132T and a third vent 133T. The first vent 131T may be formed between the free edge FE1_1 of the first flap 112a and the free edge FE2_1 of the second flap 112b, between the free edge FE3_1 of the third flap 112c and the free edge FE4_1 of the fourth flap 112d and between the free edge FE5_1 of the fifth flap 112e and the free edge FE6_1 of the sixth flap 112f because of the first slit 131. The second vent 132T may be formed between the free edge FE1_2 of the first flap 112a and the free edge FE3_3 of the third flap 112c and between the free edge FE2_2 of the second flap 112b and the free edge FE4_3 of the fourth flap 112d because of the second slit 132. The third vent 133T may be formed between the free edge FE1_3 of the first flap 112a and the free edge FE5_2 of the fifth flap 112e and between the free edge FE2_3 of the second flap 112b and the free edge FE6_2 of the sixth flap 112f because of the third slit 133.

When the venting device 100 is operated in a first mode M1 (e.g., FIG. 2 and FIG. 3, also known as close mode) to make the vents 130T temporarily closed or even temporarily sealed, the first volume VL1 is substantially disconnected from the second volume VL2, such that the ambient of the wearable sound device WSD and the ear canal of the wearable sound device user are substantially separated (isolated) from each other. On the contrary, when the venting device 100 is operated in a second/open mode M2 (e.g., FIG. 4 and FIG. 5, also known as open mode) to make the vents 130T temporarily formed, the first volume VL1 is to be connected to the second volume VL2 through the vents 130T, such that the ambient of the wearable sound device WSD and the ear canal of the wearable sound device user are connected to each other. Thus, a total size of the vents 130T in the second/open mode M2 is much greater than a total size of the vents 130T in the first/close mode M1. For example, in each of the vents 130T, its size in the first/close mode M1 is much less than its size in the second/open mode M2. Note that, the term "size of vent 130T" is an area between the opposite sidewalls (free edges of the flaps 112) of the related slit 130, and the term "total size of vents 130T" is a sum of the sizes of all vents 130T.

Similarly, vent opening may be evaluated via distance/deviation between edges of flaps. The more the distance/deviation between the edges of the flaps, the larger the vent opening is.

Note that, in addition to the first flap 112a and the second flap 112b between which the first vent 131T is formed, the venting device 100 comprises the third flap 112c, capable of moving toward a direction opposite to the direction toward which the first flap 112a moves. As can be seen from FIG. 5, with the third flap 112c moving toward opposite direction with respect to which of the first flap 112a (e.g., the third flap 112c moving downward while the first flap 112a moving upward), venting opening of the second vent 132T is enlarged, compared to the case of the first flap 112a and the third flap 112c moving toward the same direction or compared to the case of no flap by the first flap 112a. Because of the enlarged second vent 132T, the acoustic resistance of the venting device 100 may be reduced in the second/open mode M2, and it may shrink the time to achieve pressure balancing between the first volume VL1 and the second volume VL2.

Optionally, the venting device 100 is operated in a third mode M3 (e.g., FIG. 7, also known as comfort mode), wherein a total size of the vents 130T in the third mode M3 (comfort mode) is greater than a total size of the vents 130T in the first mode M1 (close mode) and less than a total size of the vents 130T in the second mode M2 (open mode). For example, in each of the vents 130T, its size in the third mode M3 is greater than its size in the first/close mode M1 and less than its size in the second/open mode M2.

According to the modes described above, a first airflow flowing between the first volume VL1 and the second volume VL2 in the first/close mode M1 is much less than a second airflow flowing between the first volume VL1 and the second volume VL2 in the second/open mode M2, and a third airflow flowing between the first volume VL1 and the second volume VL2 in the third/comfort mode M3 is greater than the first airflow and less than the second airflow.

In acoustic resistance point of view, the venting device 100 has property of $R_{ac,M2} < R_{ac,M3} < R_{ac,M1}$, where $R_{ac,M2}$, $R_{ac,M3}$ and $R_{ac,M1}$ represent acoustic resistances of the venting device 100 or the vent 130T in the second/open mode M2, the third/comfort mode M3 and the first/close mode M1, respectively.

Figure 3:
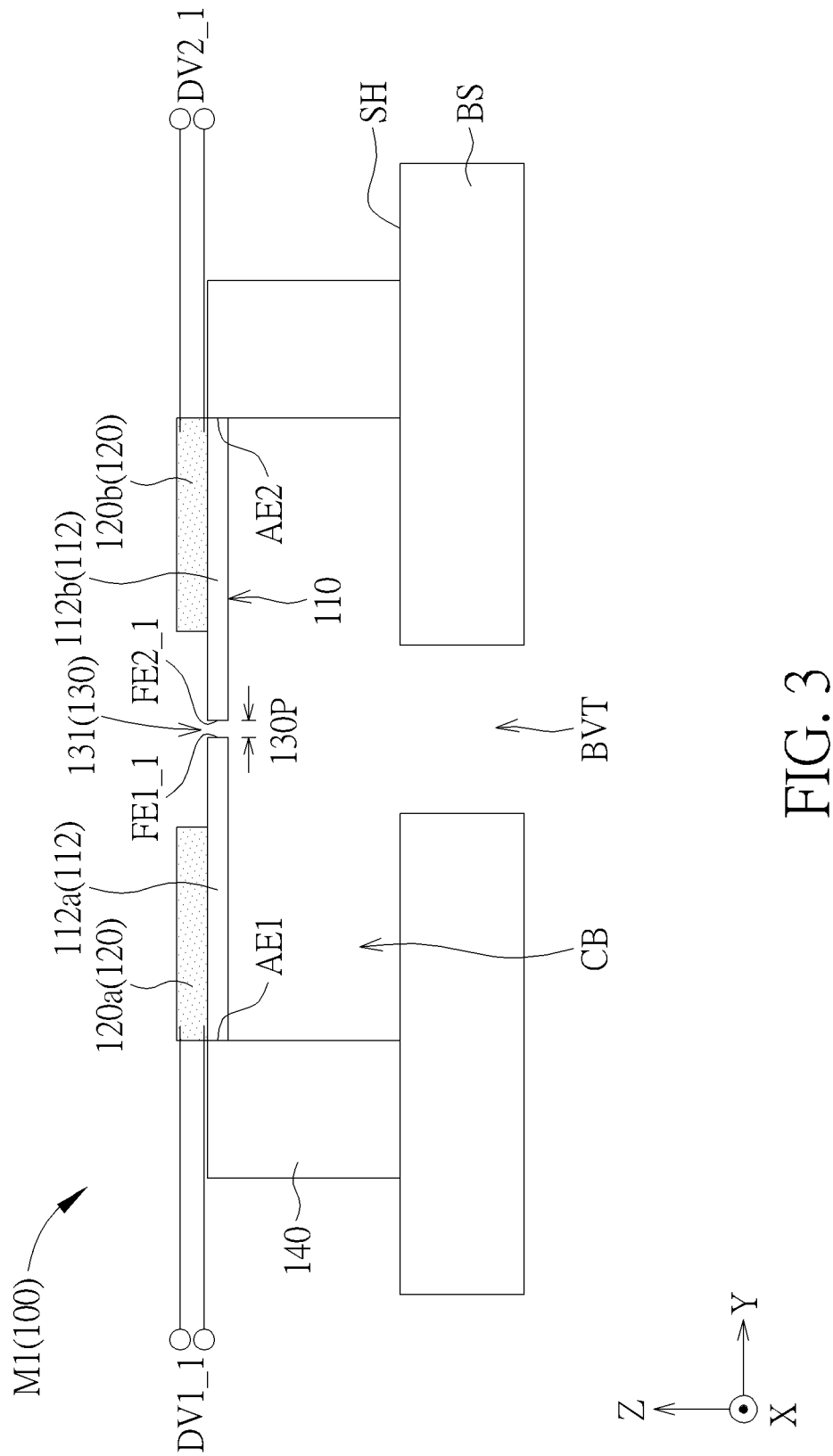
FIG. 3 is a schematic diagram of a cross sectional view illustrating a venting device in a first mode according to the first embodiment of the present invention.
Figure 4:
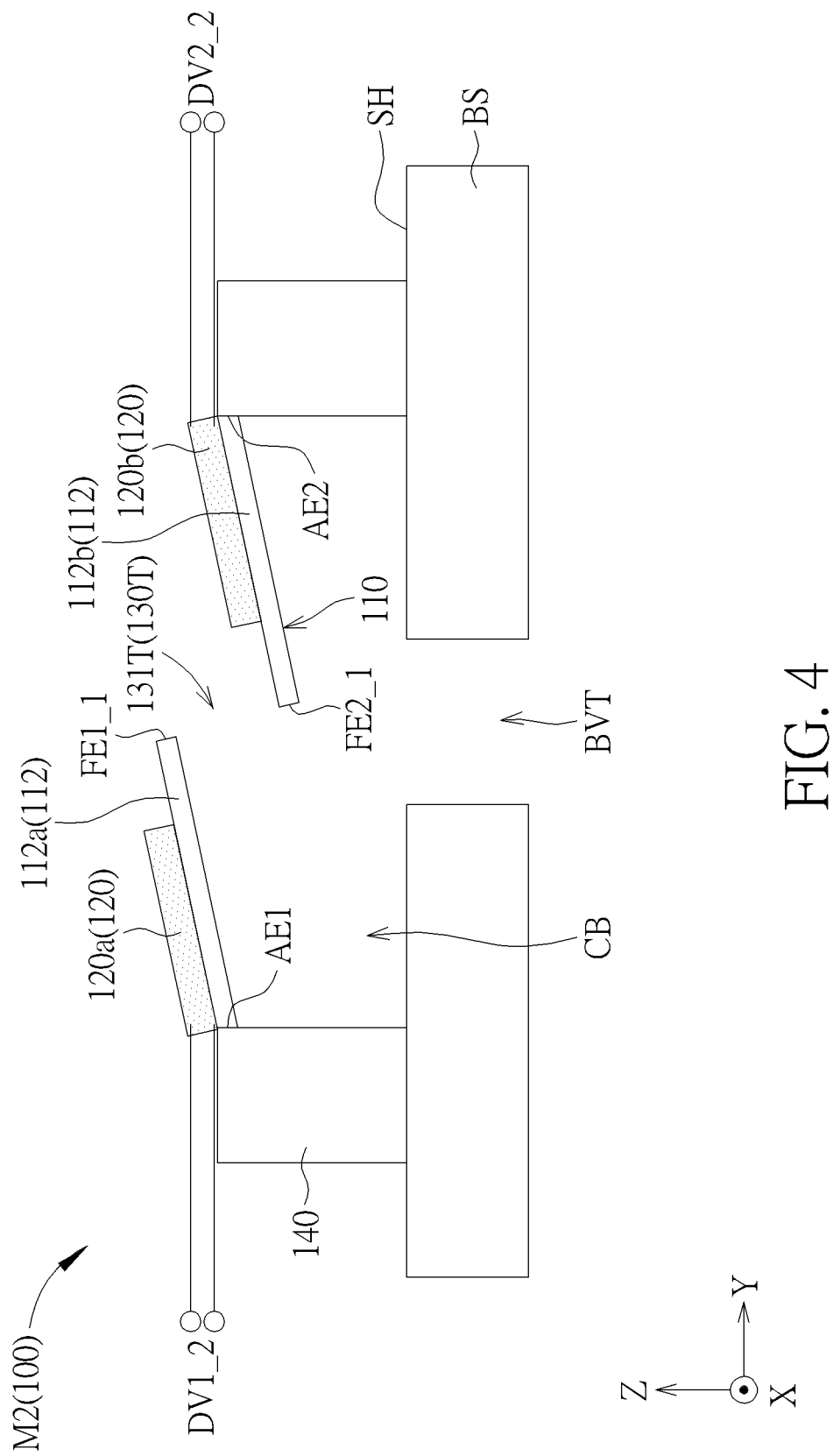
FIG. 4 is a schematic diagram of a cross sectional view illustrating a venting device in a second mode according to the first embodiment of the present invention.

FIG. 2 and FIG. 3 show an example of the venting device 100 in the first/close mode M1, wherein FIG. 2 and FIG. 3 show the first flap 112a and the second flap 112b for example. As shown in FIG. 2 and FIG. 3, the membrane 110 is actuated and maintained as a first position parallel or substantially parallel to the top surface SH of the base BS, so as to make the vents 130T closed and sealed. For example, in FIG. 2 and FIG. 3, two opposite sidewalls of the slit 130 (i.e., two free edges of different flaps 112 related to the same slit 130) partially or fully overlap with each other in the horizontal direction (i.e., the free edge FE1_1 and the free edge FE2_1 overlap with each other in the direction Y), so as to make the vent 130T closed. Since the membrane 110 has a plurality of flaps 112, all flaps 112 are actuated and maintained as their first positions to close the vents 130T in the first/close mode M1.

As shown in FIG. 2 and FIG. 3, since the membrane 110 is actuated and maintained as the first position, a gap 130P exists between two opposite sidewalls of the slit 130 (i.e., two free edges of different flaps 112 related to the same slit 130) in a horizontal plane parallel to the top surface SH of the base BS, wherein the gap 130P shall refer to a space widthwise along the slit 130, and the width of the gap 130P may be equal to or substantially equal to the width of the slit 130, but not limited thereto. The width of the slit 130 (the width of the gap 130P) may be designed based on requirement(s). For instance, the width of the slit 130 may be less than or equal to 5 μm, less than or equal to 3 μm, or less than or equal to 2 μm, or may range from 1 μm to 2 μm, but not limited thereto. Note that the size of the vent 130T in the first/close mode M1 is equivalent to the width of the gap 130P.

Since the width of the gap 130P should be sufficiently small, the airflow through the gap 130P (i.e., a narrow channel) can be highly damped due to viscous forces/resistance along the walls of the airflow pathways, known as boundary layer effect within field of fluid mechanics. Accordingly, the airflow flowing between the first volume VL1 and the second volume VL2 through the gap 130P in the first mode M1 is significantly small or negligible. In other words, when the venting device 100 is in the first mode M1, the vent 130T is closed and even sealed.

In the first/close mode M1, since the airflow flowing between the first volume VL1 and the second volume VL2 through the gap 130P in the first mode M1 is significantly small or negligible, the wearable sound device user would experience the acoustic transformation with high performance (e.g. high performance sound) in whole audio frequency range, wherein the acoustic transformation is provided by the acoustic transducer of the wearable sound device WSD.

FIG. 4 to FIG. 6 show an example of the venting device 100 in the second/open mode M2, wherein FIG. 4 shows the first flap 112a and the second flap 112b for example, and FIG. 6 shows a side view of the first vent 131T along the direction Y and shows a side view of the second vent 132T along the direction X. As shown in FIG. 4 and FIG. 5, the first flap 112a (e.g., the free edge FE1_1), the fourth flap 112d (e.g., the free edge FE4_1) and the sixth flap 112f (e.g., the free edge FE6_1) may be actuated to move toward a first direction, and the second flap 112b (e.g., the free edge FE2_1), the third flap 112c (e.g., the free edge FE3_1) and the fifth flap 112e (e.g., the free edge FE5_1) may be actuated to move toward a second direction opposite to the first direction, such that the vents 130T are temporarily formed. Namely, a moving direction of a first up-and-down movement of the free edges FE1_1, FE4_1 and FE6_1 is opposite to a moving direction of a second up-and-down movement of the free edges FE2_1, FE3_1 and FE5_1. That is to say, two adjacent flaps 112 may move toward opposite directions in the second mode M2. As shown in FIG. 4 and FIG. 5, the first direction and the second direction may be substantially parallel to the direction Z. For example, the first direction may be the same as the direction Z (i.e., +Z direction), the second direction may be a direction opposite to the direction Z (i.e., −Z direction), such that the first flap 112a, the fourth flap 112d and the sixth flap 112f may be actuated to move upwards and move above their first positions, and the second flap 112b, the third flap 112c and the fifth flap 112e may be actuated to move downwards and move below their first positions, but not limited thereto. As shown in FIG. 4 and FIG. 5, according to the movements of the flaps 112 in the second mode M2, the vents 130T are temporarily formed between two opposite sidewalls of their related slits 130 in the direction Z. Note that the movement of the flaps 112 in the second mode M2 is a venting method of the venting device 100.

In the present invention, the side view shape of the vent 130T may be a polygon (e.g., a rectangle), a shape having a curved edge or other suitable shape. For example, as shown in FIG. 5 and FIG. 6, the first vent 131T may be formed in the direction Z and has a quadrilateral shape (e.g., a rectangle), wherein an upper edge of the first vent 131T may be formed of the free edge FE1_1 of the first flap 112a, the free edge FE4_1 of the fourth flap 112d and the free edge FE6_1 of the sixth flap 112f, and a lower edge of the first vent 131T may be formed of the free edge FE2_1 of the second flap 112b, the free edge FE3_1 of the third flap 112c and the free edge FE5_1 of the fifth flap 112e, but not limited thereto. For example, as shown in FIG. 5 and FIG. 6, the second vent 132T may be formed in the direction Z and has a quadrilateral shape (e.g., a diamond), wherein two upper edges of the second vent 132T may be respectively formed of the free edge FE1_2 of the first flap 112a and the free edge FE4_3 of the fourth flap 112d, and two lower edges of the second vent 132T may be respectively formed of the free edge FE3_3 of the third flap 112c and the free edge FE2_2 of the second flap 112b, but not limited thereto. For example, the third vent 133T may be similar to the second vent 132T, such that the third vent 133T may be formed in the direction Z and has a quadrilateral shape (e.g., a diamond), wherein four edges of the third vent 133T may be respectively formed of the free edge FE1_3 of the first flap 112a, the free edge FE5_2 of the fifth flap 112e, the free edge FE2_3 of the second flap 112b and the free edge FE6_2 of the sixth flap 112f, but not limited thereto.

As shown in FIG. 6, in the second/open mode M2, the size of the first vent 131T may be greater than the size of the second vent 132T and the size of the third vent 133T. Thus, in this embodiment, the first vent 131T may be a main/ primary vent, and the second vent 132T and the third vent 133T may be side/secondary vents, but not limited thereto.

When the vent 130T is temporarily formed, the airflow may be formed to flow between the first volume VL1 and the second volume VL2 due to the pressure difference between the two sides of the membrane 110, such that the pressure caused by the occlusion effect may be released (i.e., the pressure difference between the ear canal and the ambient of the wearable sound device WSD may be released through the airflow flowing through the vent 130T), so as to suppress the occlusion effect. Moreover, since the venting device 100 formed a plurality of vents 130T in the second mode M2, the efficiency and effect of suppressing the occlusion effect may be enhanced. Note that the efficiency and effect of suppressing the occlusion effect may be enhanced by increasing the size of the vent 130T and/or the total size of vents 130T.

Accordingly, as shown in FIG. 3 and FIG. 4, the gap 130P exists between two opposite sidewalls of the slit 130 in the first/close mode M1, and the vent 130T exists between two opposite sidewalls of the slit 130 in the second/open mode M2. The width of the gap 130P is sufficiently small such that, the first airflow through the gap 130P in the first mode M1 is negligible compared to (e.g., less than 10% of) the second airflow through the vent 130T in the second mode M2.

In transition from the first/close mode M1, such as the one illustrated in FIG. 3, to the second/open mode M2, such as the one shown in FIG. 4, the first flap 112a, the fourth flap 112d and the sixth flap 112f may move upwards while the second flap 112b, the third flap 112c and the fifth flap 112e may move downwards. Conversely, in transition from the second mode M2 shown in FIG. 4 back to the first mode M1 shown in FIG. 3, the first flap 112a, the fourth flap 112d and the sixth flap 112f may move downwards while the second flap 112b, the third flap 112c and the fifth flap 112e may move upwards.

In addition, in transition from the first mode M1 to the second mode M2 or in transition from the second mode M2 back to the first mode M1, the free edge FE1_1 (also, the free edges FE4_1 and FE6_1) may be actuated to have a first displacement Uz_a in the direction Z, and the free edge FE2_1 (also, the free edges FE3_1 and FE5_1) may be actuated to have a second displacement Uz_b in the direction Z. In transition from the first mode M1 to the second mode M2, the sum of the first displacement Uz_a and the second displacement Uz_b may be greater than the thickness of the membrane 110.

In an embodiment, the first displacement Uz_a and the second displacement Uz_b may be of substantially equal in distance, but opposite in direction. The first displacement Uz_a and the second displacement Uz_b may be (temporarily) symmetrical. The movements of the free edge FE1_1 and the free edge FE2_1 (also, the movements of the free edges FE4_1 and the free edges FE3_1, and the movements of the free edges FE6_1 and the free edges FE5_1) are substantially equal length wise, but opposite in direction over any period of time. Namely, regarding the first flap 112a and the second flap 112b, if the first flap 112a and the second flap 112b are maintained as their first positions to be the first mode M1 (as shown in FIG. 3), when the membrane 110 is actuated to change to the second mode M2 or in the transition between the first mode M1 and the second mode M2 (e.g., transition from the first mode M1 to the second mode M2), a moving distance of the first flap 112a respecting its first position may be equal to a moving distance of the second flap 112b respecting its first position (as shown in FIG. 4).

A first air movement is produced because the first flap 112a, the fourth flap 112d and the sixth flap 112f are actuated to move toward the first direction, and a direction of the first air movement is related to the first direction. A second air movement is produced because the second flap 112b, the third flap 112c and the fifth flap 112e are actuated to move toward the second direction opposite to the first direction, and a direction of the second air movement is related to the second direction. Since the first air movement and the second air movement may be respectively related to the opposite directions, at least a portion of the first air movement and at least a portion of the second air movement may cancel each other when the flaps 112 are simultaneously actuated to form/close the vents 130T.

In some embodiments, since the movements of the free edges FE1_1, FE4_1 and FE6_1 and the movements of the free edges FE2_1, FE3_1 and FE5_1 are respectively symmetrical, the whole first air movement and the whole second air movement may substantially cancel each other when the flaps 112 are simultaneously actuated to form/close the vents 130T. Namely, a net air movement produced due to forming/closing the vents 130T, which contains the first air movement and the second air movement, is substantially zero. As the result, since the net air movement is substantially zero during the forming and/or closing operation of the vents 130T, the operation of the vents 130T produces no acoustic disturbance perceivable to the user of the venting device 100, and the forming and/or closing operation of the vents 130T is said to be "concealed".

FIG. 7 show an example of the venting device 100 in the third/comfort mode M3, wherein FIG. 7 shows the first flap 112a and the second flap 112b for example. As shown in FIG. 7, the membrane 110 bends downwards and is below the first position (i.e., the membrane 110 hangs downwards). Namely, the flaps 112 bend downwards and are below their first positions, such that the free edges FE1_1, FE2_1, FE3_1, FE4_1, FE5_1 and FE6_1 may move/bend toward the base BS in the third mode M3.

As shown in FIG. 3, FIG. 4 and FIG. 7, the size of the vent 130T in the third/comfort mode M3 (FIG. 7) is greater than the size of the vent 130T (i.e., the width of the gap 130P) in the first/close mode M1 (FIG. 3) and less than the size of the vent 130T in the second/open mode M2 (FIG. 4). Namely, the vent 130T is opened slightly in the third mode M3. In the condition "the vent 130T is opened slightly", the small air leakage may occur between the first volume VL1 and the second volume VL2 through a space between two opposite sidewalls of the slit 130.

For example, in FIG. 7, two opposite sidewalls of the slit 130 (i.e., two free edges of different flaps 112 related to the same slit 130) partially or fully overlap with each other in the horizontal direction (i.e., the free edge FE1_1 and the free edge FE1_2 overlap with each other in the direction Y).

In transition from the first mode M1 or second mode M2 to the third/comfort mode M3, all flaps 112 or some flaps 112 may move downwards, so as to make all flaps 112 below their first positions. In transition from the third mode M3 to the first mode M1 or second mode M2, all flaps 112 or some flaps 112 may move upwards, so as to make all flaps 112 reach their desired positions.

Moreover, as shown in FIG. 3, FIG. 4 and FIG. 7, in the first mode M1, the second mode M2, the third mode M3 and the transition between two modes, the free edges FE1_1, FE2_1, FE3_1, FE4_1, FE5_1 and FE6_1 makes no physical contact with any other component within the venting device 100.

Regarding the wearable sound device WSD including the venting device 100 of the present invention and the acoustic transducer configured to perform the acoustic transformation, a low frequency roll-off (LFRO) corner frequency of the frequency response of the acoustic transducer is affected by the mode of the venting device 100. The LFRO corner frequency is increased as the total size of the vents 130T is increased. Therefore, the LFRO corner frequencies in the first mode M1 and the third/comfort mode M3 are low, and the SPL drop of the low frequency in the first mode M1 and the SPL drop of the low frequency in the third mode M3 are not evident; the LFRO corner frequency in the second mode M2 is significantly higher than the LFRO corner frequencies in the first mode M1 and the third mode M3, and the SPL drop of the low frequency in the second mode M2 is evident. Note that, the LFRO corner frequency in the third mode M3 is slightly higher than the LFRO corner frequency in the first mode M1 because the vents 130T are slightly opened in the third mode M3.

According to the frequency response of the acoustic transducer, the first/close mode M1 of the venting device 100 makes the wearable sound device user would experience the acoustic transformation with high performance (e.g. high performance sound) in whole audio frequency range, the second/open mode M2 of the venting device 100 makes the occlusion effect suppressed, and the third/comfort mode M3 of the venting device 100 has the effect between the first mode M1 and the second mode M2 to serve as a comfort mode.

The actuator 120 may receive at least one suitable driving signal to actuate the membrane 110, so as to make the membrane 110 maintain or change its position, thereby causing the mode of the venting device 100 to be maintained or changed. As shown in FIG. 3, FIG. 4 and FIG. 7, the venting device 100 may be switched to the first mode M1, the second mode M2 or the third mode M3 based on the driving signal(s) received by the actuator 120, such that each size of the vents 130T is adjusted according to the driving signal(s) applied on the actuator 120. In the case that the membrane 110 is divided into a plurality of flaps 112, the actuating portions of the actuator 120 may receive the same driving signal or different driving signals. For example, when the actuator 120 is a piezoelectric actuator, the driving signal(s) may be driving voltage(s) and/or driving voltage difference(s) between two electrodes, and the displacement of the membrane 110 and the driving signal may have a linear relationship.

The following describes the driving signals applied on the first actuating portion 120a disposed on the first flap 112a and the second actuating portion 120b disposed on the second flap 112b. The driving signals applied on the fourth actuating portion 120d disposed on the fourth flap 112d and the sixth actuating portion 120f disposed on the sixth flap 112f may be the same as the driving signal applied on the first actuating portion 120a disposed on the first flap 112a, the driving signals applied on the third actuating portion 120c disposed on the third flap 112c and the fifth actuating portion 120e disposed on the fifth flap 112e may be the same as the driving signal applied on the second actuating portion 120b disposed on the second flap 112b, and therefore, these parts will not be redundantly described.

As shown in FIG. 3, in the first/close mode M1, the first actuating portion 120a disposed on the first flap 112a receives a driving signal DV1_1, and the second actuating portion 120b disposed on the second flap 112b receives a driving signal DV2_1. The first flap 112a and the second flap 112b move to the first position or are maintained as the first position according to the driving signal DV1_1 and the driving signal DV2_1, so as to close or seal the vent 130T. The driving signal DV1_1 and the driving signal DV2_1 may be designed based on requirement(s). In some embodiments, the driving signal DV1_1 may be a constant voltage with a first threshold value, the driving signal DV2_1 may be a constant voltage with a second threshold value, and the driving signal DV1_1 and the driving signal DV2_1 may be the same or substantially the same (i.e., the first threshold value is the same as or substantially the same as second threshold value), but not limited thereto. For instance, the driving signal DV1_1 and the driving signal DV2_1 may be 15V, but not limited thereto.

As shown in FIG. 4, in the second/open mode M2, the first actuating portion 120a disposed on the first flap 112a receives a driving signal DV1_2, and the second actuating portion 120b disposed on the second flap 112b receives a driving signal DV2_2. According to the driving signal DV1_2 and the driving signal DV2_2, the free edge FE1_1 moves above the first position, and the free edge FE2_1 moves below the first position, so as to form the vent 130T. The driving signal DV1_2 and the driving signal DV2_2 may be designed based on requirement(s). In some embodiments, the driving signal DV1_2 may be a constant voltage higher than the first threshold value, the driving signal DV2_2 may be a constant voltage lower than the second threshold value, and the driving signal DV1_2 and the driving signal DV2_2 may be different, wherein the size of the vent 130T in the second mode M2 is related to the difference between the driving signal DV1_2 and the driving signal DV2_2. For instance, the driving signal DV1_2 may be 30V, and the driving signal DV2_2 may be 0V, but not limited thereto.

In addition, due to the design of the driving signal DV1_2 and the driving signal DV2_2, the movements of the free edge FE1_1 and the free edge FE2_1 are temporarily symmetrical with respect to the first position. For example, a different between the driving signal DV1_2 and the first threshold value may be the same as a different between the driving signal DV2_2 and the second threshold value, but not limited thereto.

As shown in FIG. 7, in the third/comfort mode M3, the first actuating portion 120a disposed on the first flap 112a receives a driving signal DV1_3, and the second actuating portion 120b disposed on the second flap 112b receives a driving signal DV2_3. According to the driving signal DV1_3 and the driving signal DV2_3, the free edge FE1_1 and the free edge FE2_1 move below the first position, such that the vent 130T is opened slightly. The driving signal DV1_3 and the driving signal DV2_3 may be designed based on requirement(s). In some embodiments, the driving signal DV1_3 may be a constant voltage lower than the first threshold value, the driving signal DV2_3 may be a constant voltage lower than the second threshold value, and the driving signal DV1_3 and the driving signal DV2_3 may be the same or substantially the same, but not limited thereto. For instance, the driving signal DV1_3 and the driving signal DV2_3 may be 0V or ground voltage, but not limited thereto. In some embodiments, the first actuating portion 120a and the second actuating portion 120b may be floating, but not limited thereto.

According to the driving signals in these modes, the venting device 100 has the lowest power consumption in the third/comfort mode M3. In some embodiments, no voltage is applied on the actuator 120 (i.e., the driving signal applied on the actuator 120 is 0V or ground voltage, or the actuator 120 is floating) in the third mode M3. In some case, in order to decrease the power consumption of the venting device 100, the venting device 100 may be in the third mode M3 (e.g., the comfort mode) normally, and the venting device 100 may be changed to the first/close mode M1 or the second/open mode M2 if necessary (e.g., the venting device 100 may be changed to the first mode M1 for the acoustic transformation with high performance, the venting device 100 may be changed to the second mode M2 for suppressing the occlusion effect), but not limited thereto.

In some embodiments, the driving signal applied on the first actuating portion 120*a* and the driving signal applied on the second actuating portion 120*b* may be unipolar with respect to the ground voltage. For example, according to the aforementioned driving signals DV1_1, DV1_2, DV1_3, DV2_1, DV2_2 and DV2_3, the driving signal applied on the first actuating portion 120*a* and the driving signal applied on the second actuating portion 120*b* may range from 0V to 30V, but not limited thereto.

In the present invention, the driving signal applied on the actuator 120 does not exceed a breakdown voltage of the actuator 120, so as to make the operation of the venting device 100 stable or to make the venting device 100 less distorted, but not limited thereto.

Figure 8:
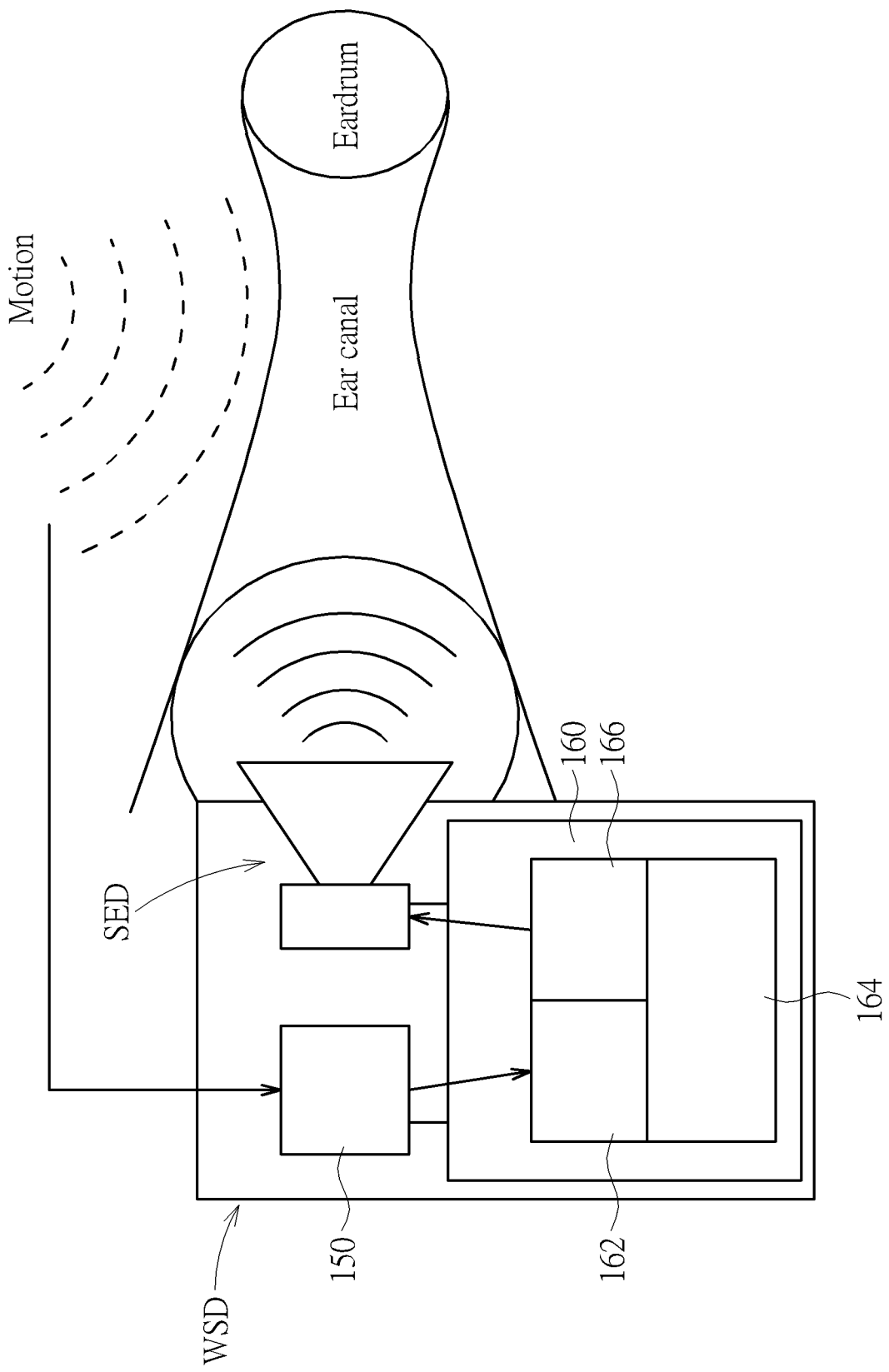
FIG. 8 is a schematic diagram illustrating a wearable sound device with a venting device according to an embodiment of the present invention.

Referring to FIG. 8, FIG. 8 is a schematic diagram illustrating a wearable sound device with a venting device according to an embodiment of the present invention. As shown in FIG. 8, the wearable sound device WSD may further include a sensing device 150 and a controller 160 electrically connected to the sensing device 150, the acoustic transducer and the venting device 100 (e.g., the actuator 120 of the venting device 100). In FIG. 8, the component SED includes the acoustic transducer and the venting device 100, so as to make FIG. 8 simple and clear.

The sensing device 150 may be configured to sense any required factor outside the wearable sound device WSD and corresponding to generate a sensing result. For example, the sensing device 150 may use an infrared (IR) sensing method, an optical sensing method, an acoustic sensing method, an ultrasonic sensing method, a capacitive sensing method or other suitable sensing method to sense any required factor, but not limited thereto.

In some embodiments, whether the vent 130T is formed is determined according to the sensing result. The vent 130T is formed when a sensed quantity indicated by the sensing result crosses a certain threshold with a first polarity, and the vent 130T is closed when the sensed quantity crosses the certain threshold with a second polarity opposite to the first polarity. For instance, the first polarity may be from low to high, and the second polarity may be from high to low, such that the vent 130T is formed when the sensed quantity is changed from lower than the certain threshold to higher than the certain threshold, and the vent 130T is closed when the sensed quantity is changed from higher than the certain threshold to lower than the certain threshold, but not limited thereto.

Moreover, in some embodiments, the size of the vent 130T (or the total size of the vents 130T) may be monotonically related to the sensed quantity indicated by the sensing result. Namely, the size of the vent 130T (or the total size of the vents 130T) increases or decreases as the sensed quantity increases or decreases.

In some embodiments, the sensing device 150 may optionally include a motion sensor configured to detect a body motion of the user and/or a motion of the wearable sound device WSD. For example, the sensing device 150 may detect the body motion causing the occlusion effect, such as walking, jogging, talking, eating, etc. In some embodiments, the sensed quantity indicated by the sensing result represents the body motion of the user and/or the motion of the wearable sound device WSD, and the size of the vent 130T (or the total size of the vents 130T) is correlated to the motion sensed. For instance, the size of the vent 130T (or the total size of the vents 130T) increases as the motion increases.

In some embodiments, the sensing device 150 may optionally include a proximity sensor configured to sense a distance between an object and the proximity sensor. In some embodiments, the sensed quantity indicated by the sensing result represents the distance between the object and the proximity sensor, and the size of the vent 130T (or the total size of the vents 130T) is correlated to the distance sensed. For instance, the vent 130T is formed when this distance smaller than a predetermined distance, and the size of the vent 130T (or the total size of the vents 130T) increases as this distance decreases. For instance, if the user wants to form the vent 130T, the user can use any suitable object (e.g., the hand) to approach the wearable sound device WSD, so as to make the proximity sensor sense this object to correspondingly generate the sensing result, thereby forming the vent 130T.

In addition, the proximity sensor may further have a function for detecting that the user (predictably) taps or touches the wearable sound device WSD having the venting device 100 because these motions may also cause the occlusion effect.

In some embodiments, the sensing device 150 may optionally include a force sensor configured to sense the force applied on the force sensor of the wearable sound device WSD, the sensed quantity indicated by the sensing result represents the force pressing on the wearable sound device WSD, and the size of the vent 130T (or the total size of the vents 130T) is correlated to the force sensed.

In some embodiments, the sensing device 150 may optionally include a light sensor configured to sense an ambient light of the wearable sound device WSD, the sensed quantity indicated by the sensing result represents the luminance of the ambient light sensed by the light sensor, and the size of the vent 130T (or the total size of the vents 130T) is correlated to the luminance of the ambient light sensed.

In some embodiments, the sensing device may optionally include an acoustic sensor, such as microphone, configured to sense the sound outside the wearable sound device WSD. For example, the sensed quantity indicated by the sensing result represents the SPL of the sound sensed by the acoustic sensor, and the size of the vent 130T (or the total size of the vents 130T) is correlated to the sound sensed by the acoustic sensor, but not limited thereto.

The controller 160 is configured to generate the driving signals applied on the acoustic transducer and the venting device 100, so as to control the acoustic transducer to perform the acoustic transformation and to control the mode of the venting device 100.

The controller 160 may be designed based on requirement(s), and the controller 160 may include any suitable component. For example, in FIG. 8, the controller 160 may include an analog-to-digital converter (ADC) 162, a digital signal processing (DSP) unit 164, a digital-to-analog converter (DAC) 166, any other suitable component or a combination thereof. For example, the controller 160 may be an integrated circuit, but not limited thereto.

The controller 160 generates the driving signals (e.g., aforementioned driving signals DV1_1, DV1_2, DV1_3, DV2_1, DV2_2 and DV2_3) applied on the actuator 120 of the venting device 100, so as to control the mode of the venting device 100 and the size of the vent 130T (or the total size of the vents 130T). Thus, the controller 160 controls the venting device 100 to form the vent 130T for suppressing the occlusion effect or close the vent 130T for making wearable sound device user experience the acoustic transformation with high performance in whole audio frequency range.

In some embodiments, the driving signals applied on the actuator 120 of the venting device 100 may be generated according to the sensing result, but not limited thereto. In some embodiments, since the size of the vent 130T may be monotonically related to the sensed quantity indicated by the sensing result, the driving signals applied on the actuator 120 may have a monotonic relationship with the sensed quantity indicated by the sensing result.

When the sensing device 150 includes the motion sensor, magnitudes of the driving signals applied on the actuator 120 may increase (or decrease) as the motion increases, but not limited thereto. Similarly, when the sensing device 150 includes the proximity sensor, magnitudes of the driving signals applied on the actuator 120 may increase (or decrease) as the distance decreases or decreases below a threshold, but not limited thereto. Similarly, when the sensing device 150 includes the force sensor, magnitudes of the driving signals applied on the actuator 120 may increase (or decrease) as the force increases, but not limited thereto. Similarly, when the sensing device 150 includes the light sensor, magnitudes of the driving signals applied on the actuator 120 may increase (or decrease) as the luminance of the ambient light decreases, but not limited thereto.

Figure 9:
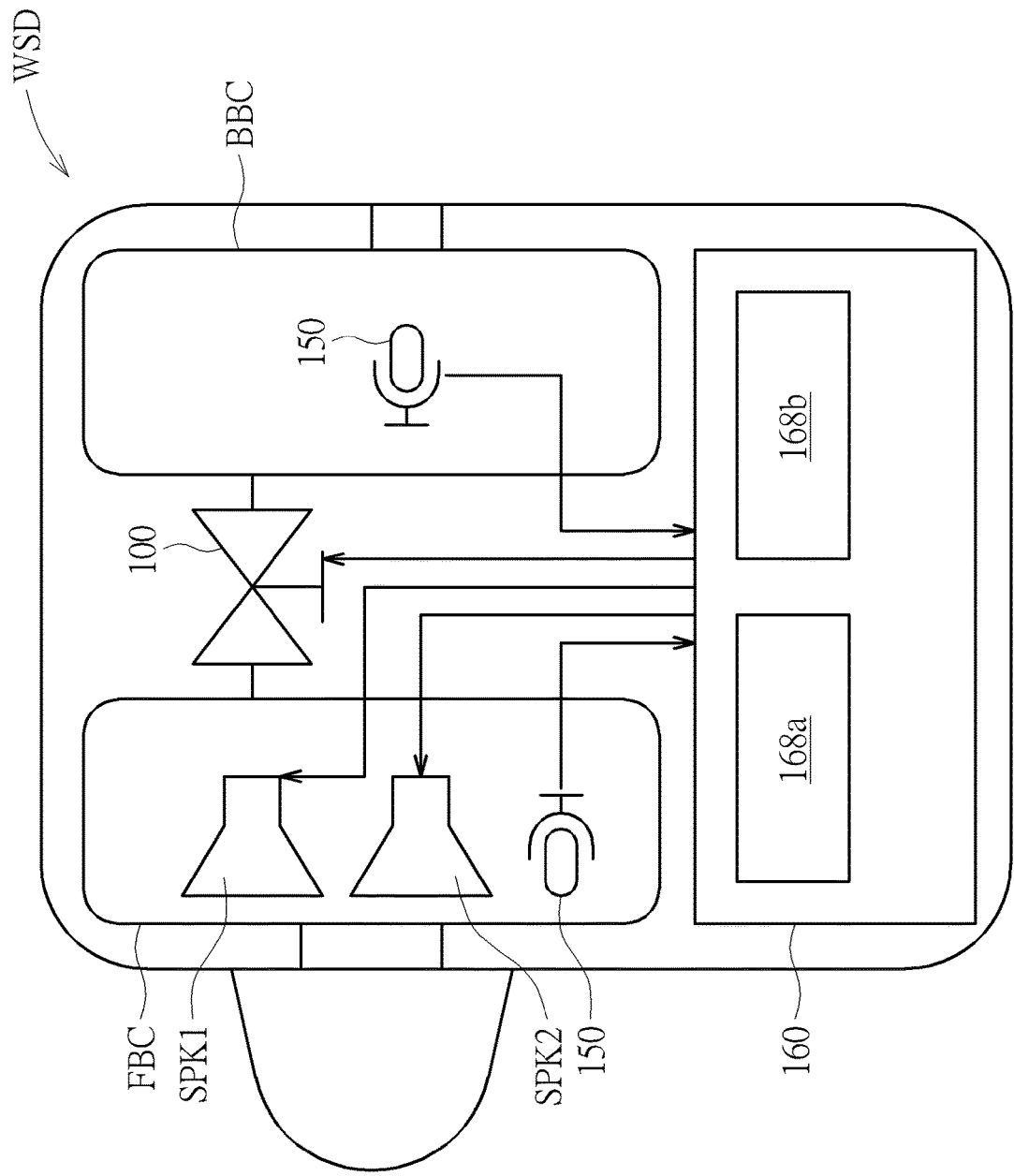
FIG. 9 is a schematic diagram illustrating a wearable sound device with a venting device according to an embodiment of the present invention.

Referring to FIG. 9, FIG. 9 is a schematic diagram illustrating a wearable sound device with a venting device according to an embodiment of the present invention. The wearable sound device WSD shown in FIG. 9 may include a plurality of acoustic transducers (e.g., acoustic transducers SPK1 and SPK2) configured to perform the acoustic transformation. Namely, the acoustic waves are produced by the acoustic transducers SPK1 and SPK2, and the venting device 100 is configured to be actuated to form or close the vent 130T for suppressing the occlusion effect. As shown in FIG. 9, the acoustic waves produced by the acoustic transducers SPK1 and SPK2 may propagate from a front chamber FBC of the wearable sound device WSD to the ear canal of the wearable sound device user.

The frequency range of the acoustic wave produced by each acoustic transducer may be designed based on requirement(s). For instance, an embodiment of acoustic transducer may produce the acoustic wave with the frequency range covering the human audible frequency range (e.g., from 20 Hz to 20 kHz), but not limited thereto. For instance, another embodiment of acoustic transducer may produce the acoustic wave with the frequency higher than a specific frequency, such that this acoustic transducer may be a high frequency sound unit (tweeter), but not limited thereto. For instance, another embodiment of acoustic transducer may produce the acoustic wave with the frequency lower than a specific frequency, such that this acoustic transducer may be a low frequency sound unit (woofer), but not limited thereto. Note that the specific frequency may be a value ranging from 800 Hz to 4 kHz (e.g., 1.44 kHz), but not limited thereto. The details of the high frequency sound unit and the low frequency sound unit may be referred to U.S. application Ser. No. 17/153,849 filed by Applicant, which is not narrated herein for brevity.

The acoustic transducers SPK1 and SPK2 may be the same or different. For example, the acoustic transducer SPK1 may be a high frequency sound unit (tweeter), and the acoustic transducer SPK2 may be a low frequency sound unit (woofer), but not limited thereto.

The front chamber FBC of the wearable sound device WSD shown in FIG. 9 may be connected to the first volume VL1 in the housing structure HSS where the venting device 100 is disposed (shown in FIG. 2). For example, the front chamber FBC of the wearable sound device WSD may be directly connected to the first volume VL1 in the housing structure HSS, or be connected to the first volume VL1 in the housing structure HSS through the ear canal of the wearable sound device user. Also, a back chamber BBC of the wearable sound device WSD shown in FIG. 9 may be connected to the second volume VL2 in the housing structure HSS where the venting device 100 is disposed (shown in FIG. 2). For example, the back chamber BBC of the wearable sound device WSD may be directly connected to the second volume VL2 in the housing structure HSS, or be connected to the second volume VL2 in the housing structure HSS through the ambient of the wearable sound device WSD.

The sensing devices 150, which may include acoustic sensor(s) (e.g., microphone(s)), may be disposed in the front chamber FBC and/or the back chamber BBC of the wearable sound device WSD, wherein the sensing devices 150 is configured to detect the occlusion event.

The venting device 100, the acoustic transducers SPK1 and SPK2 and the sensing devices 150 may be electrically connected to the controller 160. The controller 160 may apply acoustic driving signals on the acoustic transducers SPK1 and SPK2, such that the acoustic wave produced by the acoustic transducers SPK1 and SPK2 may be corresponding to the acoustic driving signals. The controller 160 may apply the driving signal based on the sensing result of the sensing device 150 on the venting device 100, so as to form or close the vent 130T. For example, the controller 160 may include a device controller 168a and a device driver 168b, but not limited thereto. For instance, the device controller 168a may determine the voltages applied on or to be applied on the actuating portions of the actuator 120 according to the sensing result generated by the sensing device 150, but not limited thereto.

In the following, the details of a method of manufacturing a venting device 100 will be further exemplarily explained. Note that in the following manufacturing method, the actuator 120 of the venting device 100 may include a piezoelectric actuator for example, but not limited thereto. The actuator 120 of the venting device 100 may include any suitable type actuator.

In the following manufacturing method, the forming process may include atomic layer deposition (ALD), a chemical vapor deposition (CVD) and other suitable process(es) or a combination thereof. The patterning process may include such as a photolithography, an etching process, any other suitable process(es) or a combination thereof.

Figure 10:
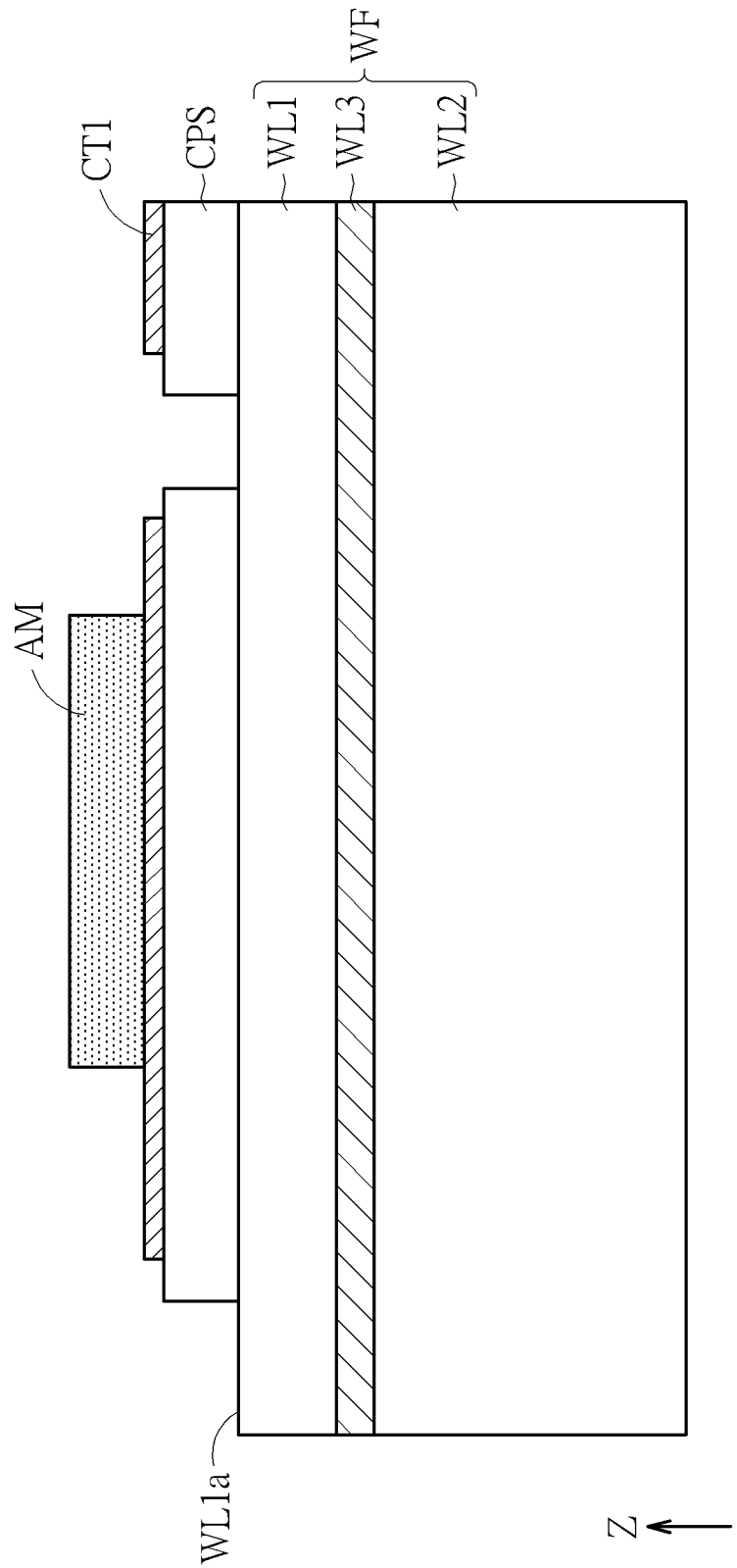
FIG. 10 to FIG. 15 are schematic diagrams illustrating structures at different stages of a manufacturing method of a venting device according to an embodiment of the present invention.

Referring to FIG. 10 to FIG. 15, FIG. 10 to FIG. 15 are schematic diagrams illustrating structures at different stages of a manufacturing method of a venting device according to an embodiment of the present invention. In this embodiment, the venting device 100 may be manufactured by at least one semiconductor process to be a MEMS chip, but not limited thereto. As shown in FIG. 10, a wafer WF is provided, wherein the wafer WF may include a first layer WL1 and a second layer WL2, and may optionally include an insulating layer WL3 between the first layer WL1 and the second layer WL2.

The first layer WL1, the insulating layer WL3 and the second layer WL2 may individually include any suitable material, such that the wafer WF may be any suitable type. For instance, the first layer WL1 and the second layer WL2 may individually include silicon (e.g., single crystalline silicon or poly-crystalline silicon), silicon compound (e.g., silicon carbide, silicon oxide), germanium, germanium compound, gallium, gallium compound (e.g., gallium nitride or gallium arsenide), other suitable material or a combination thereof. In some embodiments, the first layer WL1 may include single crystalline silicon, such that the wafer WF may be a silicon on insulator (SOI) wafer, but not limited thereto. For instance, the insulating layer WL3 may include oxide, such as silicon oxide (e.g., silicon dioxide), but not limited thereto. The thicknesses of the first layer WL1, the insulating layer WL3 and the second layer WL2 may be individually adjusted based on requirement(s).

In FIG. 10, a compensation oxide layer CPS may be optionally formed on an upper side of the wafer WF, wherein the upper side is upper than a top surface WL1a of the first layer WL1 opposite to the second layer WL2, such that the first layer WL1 is between the compensation oxide layer CPS and the second layer WL2. The material of oxide contained in the compensation oxide layer CPS and the thickness of the compensation oxide layer CPS may be designed based on requirement(s).

In FIG. 10, a first conductive layer CT1 and an actuating material AM may be formed on the upper side of the wafer WF (on the first layer WL1) in sequence, such that the first conductive layer CT1 may be between the actuating material AM and the first layer WL1. In some embodiments, the first conductive layer CT1 may be in contact with the actuating material AM.

The first conductive layer CT1 may include any suitable conductive material, and the actuating material AM may include any suitable material. In some embodiments, the first conductive layer CT1 may include metal, and the actuating material AM may include a piezoelectric material, but not limited thereto. For example, the piezoelectric material may include such as a lead-zirconate-titanate (PZT) material, but not limited thereto. Moreover, the thicknesses of the first conductive layer CT1 and the actuating material AM may be individually adjusted based on requirement(s).

Then, in FIG. 10, the actuating material AM, the first conductive layer CT1 and the compensation oxide layer CPS may be patterned in sequence.

Figure 11:
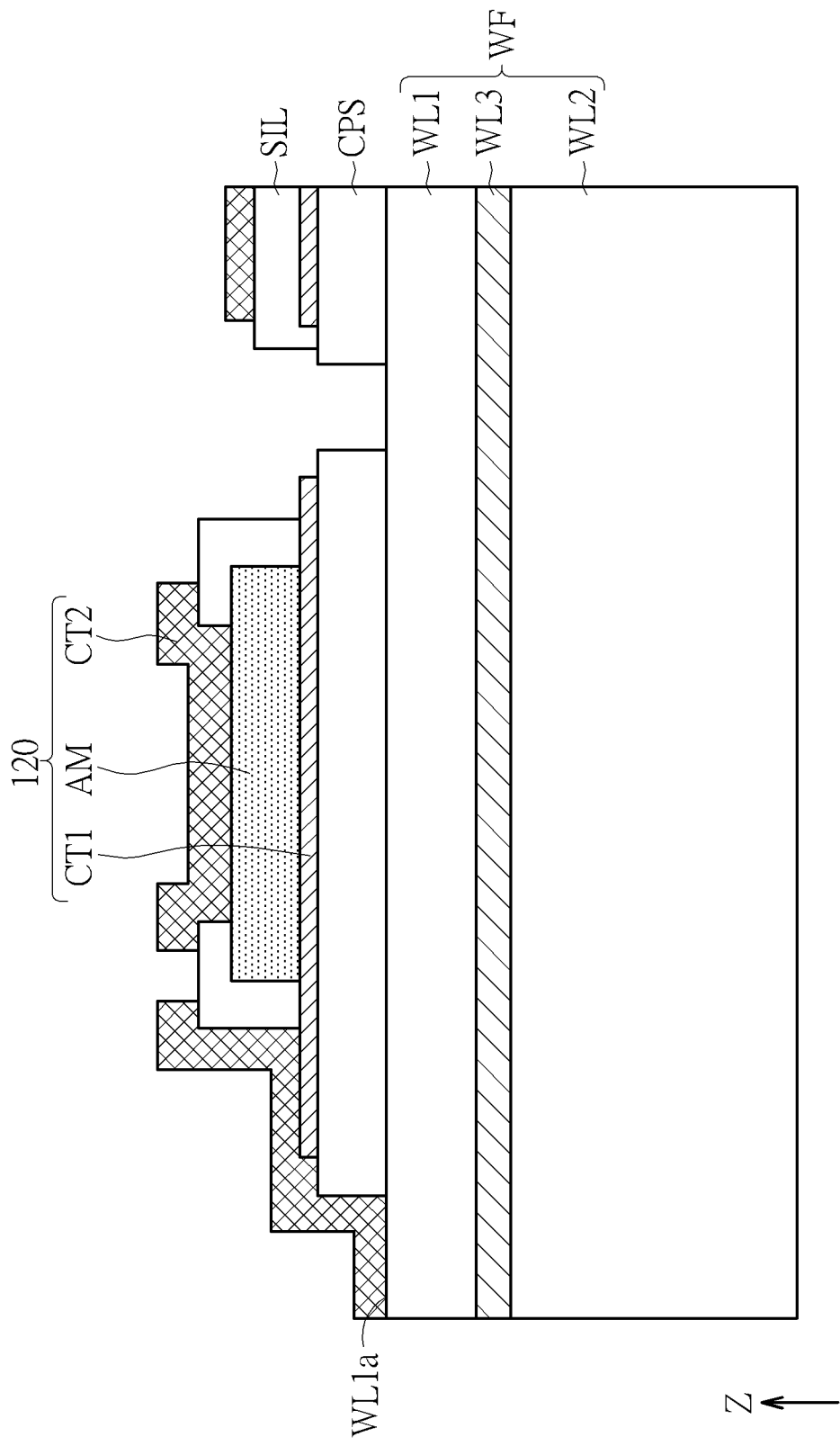

As shown in FIG. 11, a separating insulating layer SIL may be formed on the actuating material AM and be patterned. The thickness of the separating insulating layer SIL and the material of the separating insulating layer SIL may be designed based on requirement(s). For instance, the material of the separating insulating layer SIL may be oxide, but not limited thereto.

As shown in FIG. 11, a second conductive layer CT2 may be formed on the actuating material AM and the separating insulating layer SIL, and then, the second conductive layer CT2 may be patterned. The thickness of the second conductive layer CT2 and the material of the second conductive layer CT2 may be designed based on requirement(s). For instance, the second conductive layer CT2 may include metal, but not limited thereto. For instance, the second conductive layer CT2 may be in contact with the actuating material AM.

The actuating material AM, the first conductive layer CT1 and the second conductive layer CT2 may be sub-layers in the actuator 120 of the venting device 100, so as to make the actuator 120 including a piezoelectric actuator including two electrodes and the actuating material AM between two electrodes.

In FIG. 11, the separating insulating layer SIL may be configured to separate at least a portion of the first conductive layer CT1 from at least a portion of the second conductive layer CT2.

Figure 12:
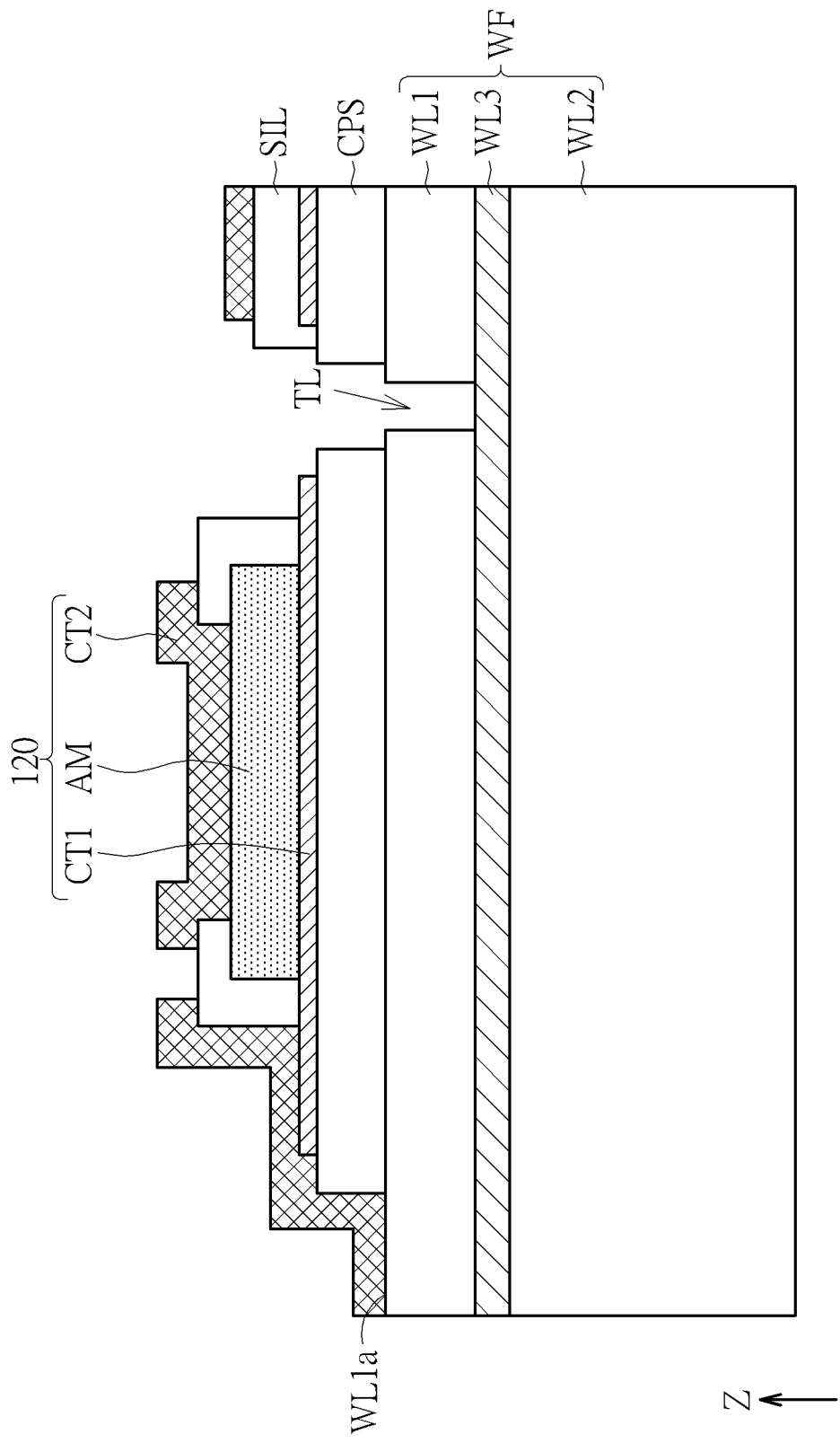

As shown in FIG. 12, the first layer WL1 of the wafer WF may be patterned, so as to form a trench line TL. In FIG. 12, the trench line TL is a portion where the first layer WL1 is removed. That is to say, the trench line TL is between two parts of the first layer WL1.

Figure 13:
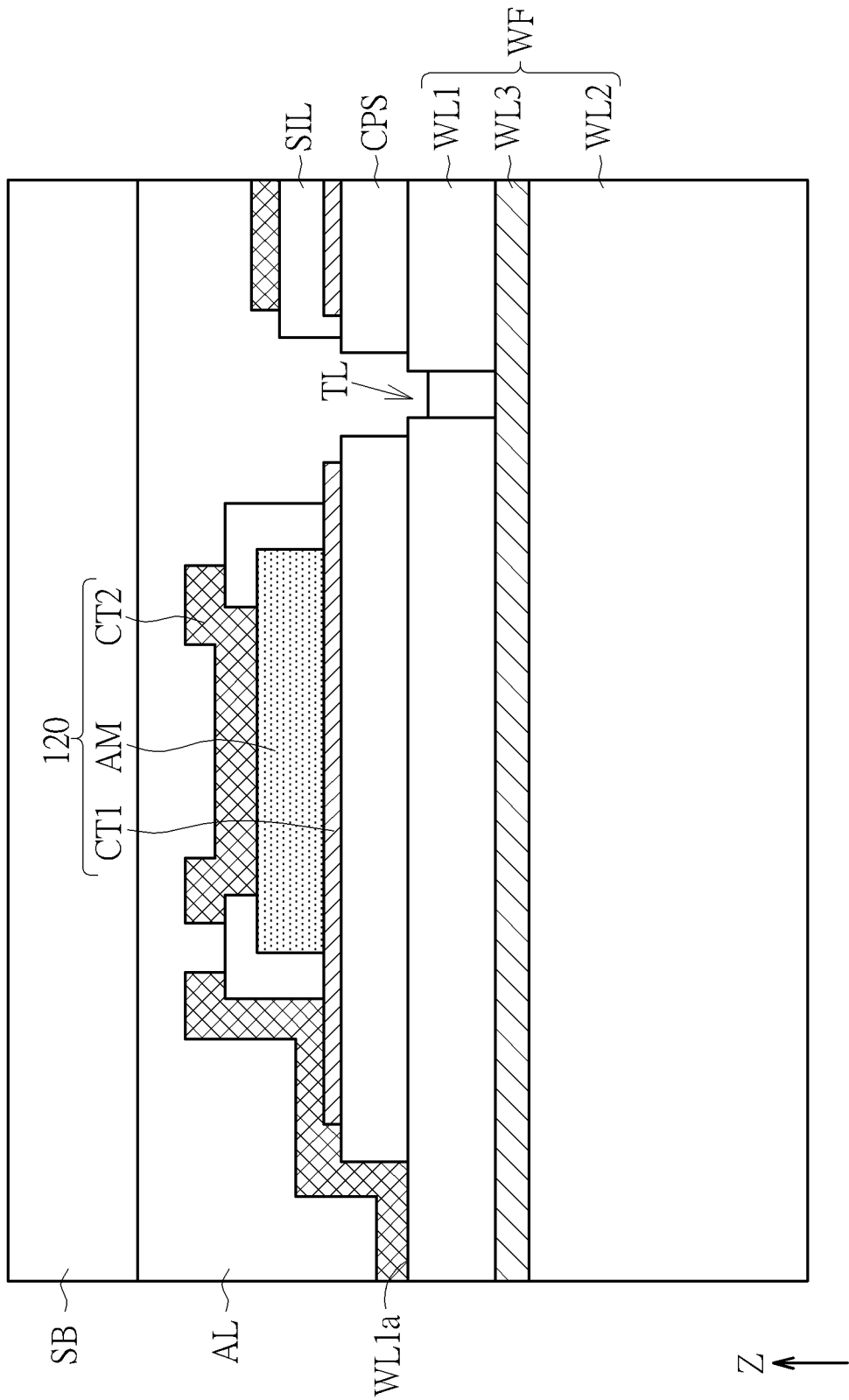

As shown in FIG. 13, the wafer WF is disposed on a substrate SB and an adhering layer AL, wherein the adhering layer AL is adhered between the substrate SB and the first layer WL1 of the wafer WF. In FIG. 13, the actuator 120 is between the wafer WF and the substrate SB. Due to this step, the first layer WL1 of the wafer WF and the structures on the upper side of the wafer WF (i.e., the structures upper than the top surface WL1a of the wafer WF) may be protected in subsequent steps.

Figure 14:
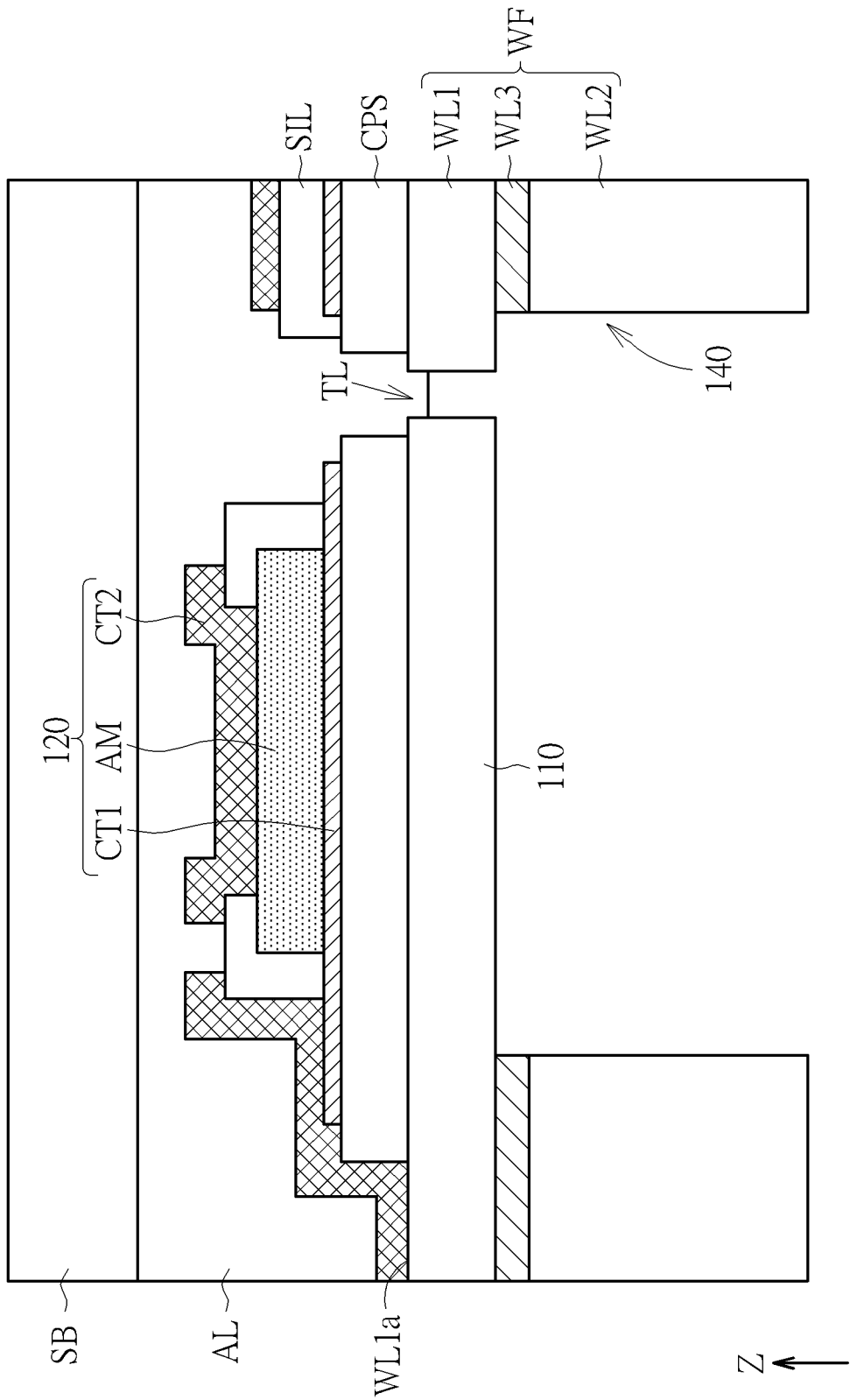

As shown in FIG. 14, the second layer WL2 of the wafer WF may be patterned, so as to make the second layer WL2 form the anchor structure 140 and to make the first layer WL1 form the membrane 110 anchored by the anchor structure 140. In detail, the second layer WL2 of the wafer WF may have a first part and a second part, the first part of the second layer WL2 may be removed, and the second part of the second layer WL2 may form the anchor structure 140. Since the first part of the second layer WL2 is removed, the first layer WL1 forms the membrane 110, wherein the membrane 110 is corresponding to the removing first part of the second layer WL2 in the direction Z. For example, the first part of the second layer WL2 may be removed by a deep reactive ion etching (DRIE) process, but not limited thereto. Note that the flaps 112 of the membrane 110 are determined when patterning the first layer WL1 of the wafer WF to form the trench line(s) TL.

Optionally, in FIG. 14, since the insulating layer WL3 of the wafer WF exists, after the second layer WL2 of the wafer WF is patterned, a part of the insulating layer WL3 corresponding to the first part of the second layer WL2 may be removed also, so as to make the first layer WL1 form the membrane 110, but not limited thereto.

Furthermore, in FIG. 14, the second part of the second layer WL2, a portion of the insulating layer WL3 overlapping the second part of the second layer WL2 and a portion of the first layer WL1 overlapping the second part of the second layer WL2 may be combined to serve as the anchor structure 140.

Figure 15:
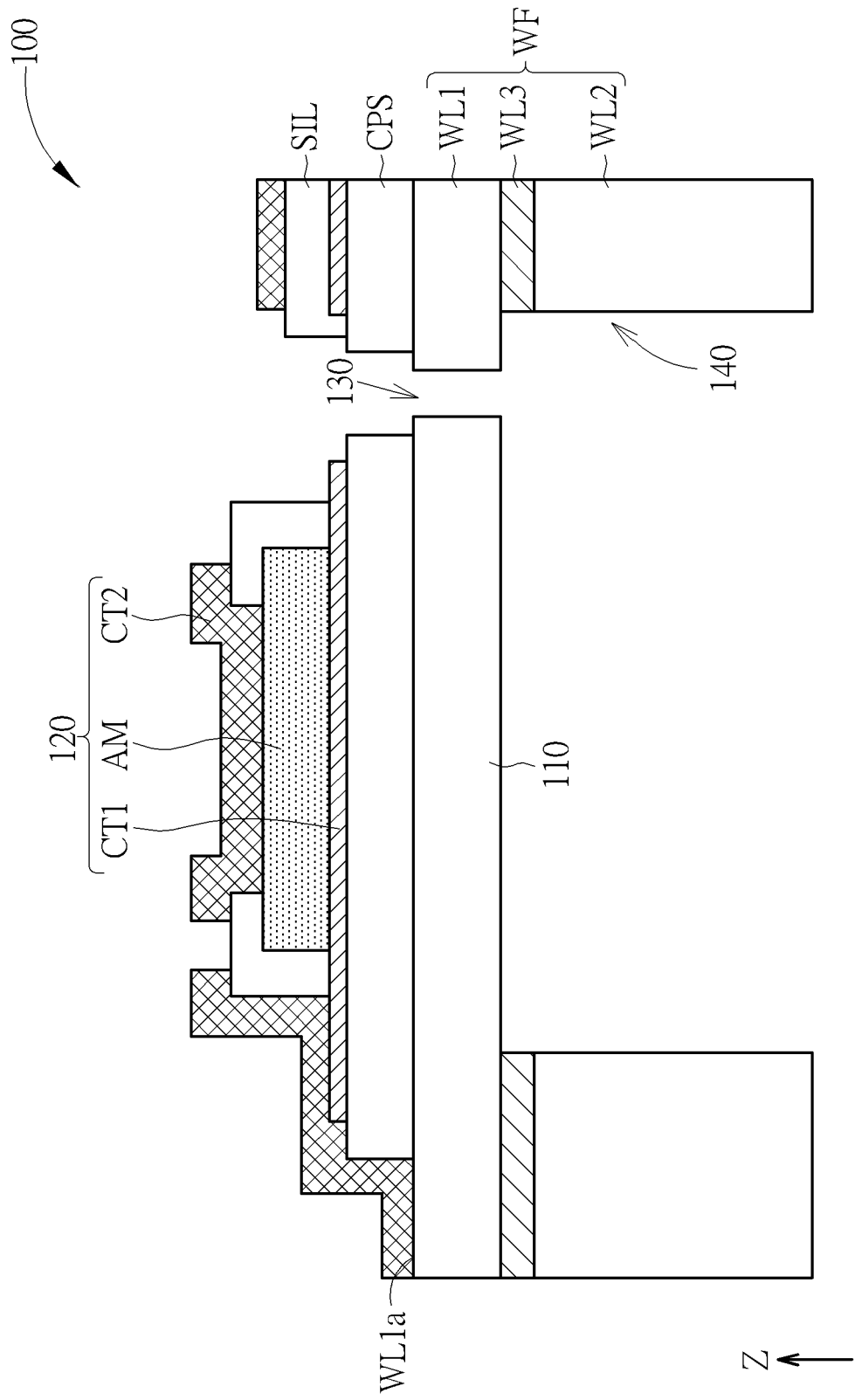

As shown in FIG. 15, the substrate SB and the adhering layer AL are removed by a suitable process, so as to complete the manufacture of the venting device 100. For example, the substrate SB and the adhering layer AL may be removed by a peel-off process, but not limited thereto.

In FIG. 15, since the first part of the second layer WL2 is removed to make the membrane 110 included in the first layer WL1 be formed, the slit 130 is formed within and penetrates through the membrane 110 because of the trench line TL. Since the slit 130 is formed because of the trench line TL, the width of the trench line TL may be designed based on the requirement of the slit 130. For example, the width of the trench line TL may be less than or equal to 5 µm, less than or equal to 3 µm, or less than or equal to 2 µm, or may range from 1 µm to 2 µm, so as to make the slit 130 have desire width, but not limited thereto.

The venting device, the wearable sound device and the manufacturing method of the venting device of the present invention is not limited by the above embodiment(s). Other embodiments of the present invention are described below.

For ease of comparison, same components will be labeled with the same symbol in the following. The following descriptions relate the differences between each of the embodiments, and repeated parts will not be redundantly described.

Figure 16:
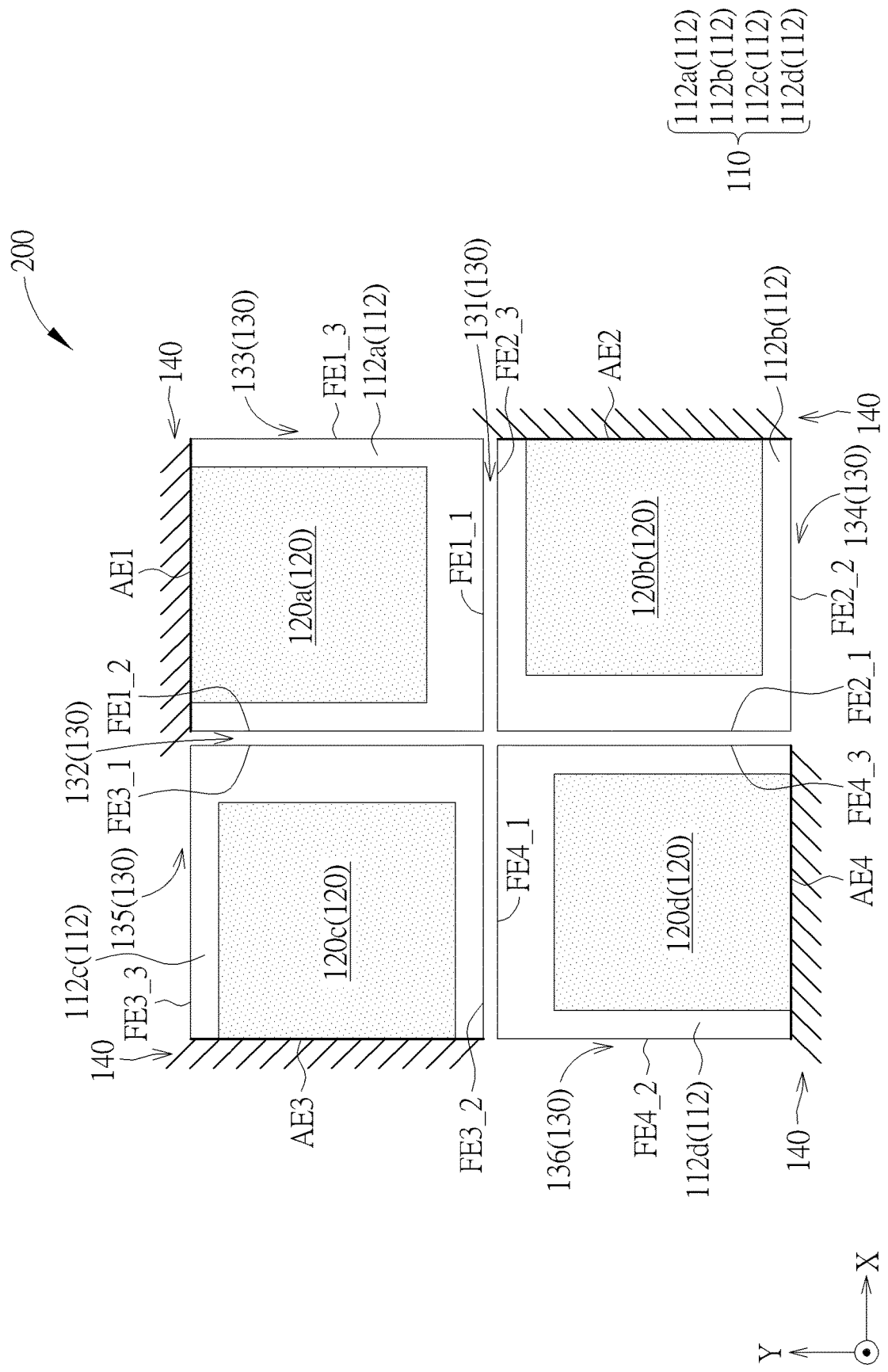
FIG. 16 is a schematic diagram of a top view illustrating a venting device according to a second embodiment of the present invention.
Figure 17:
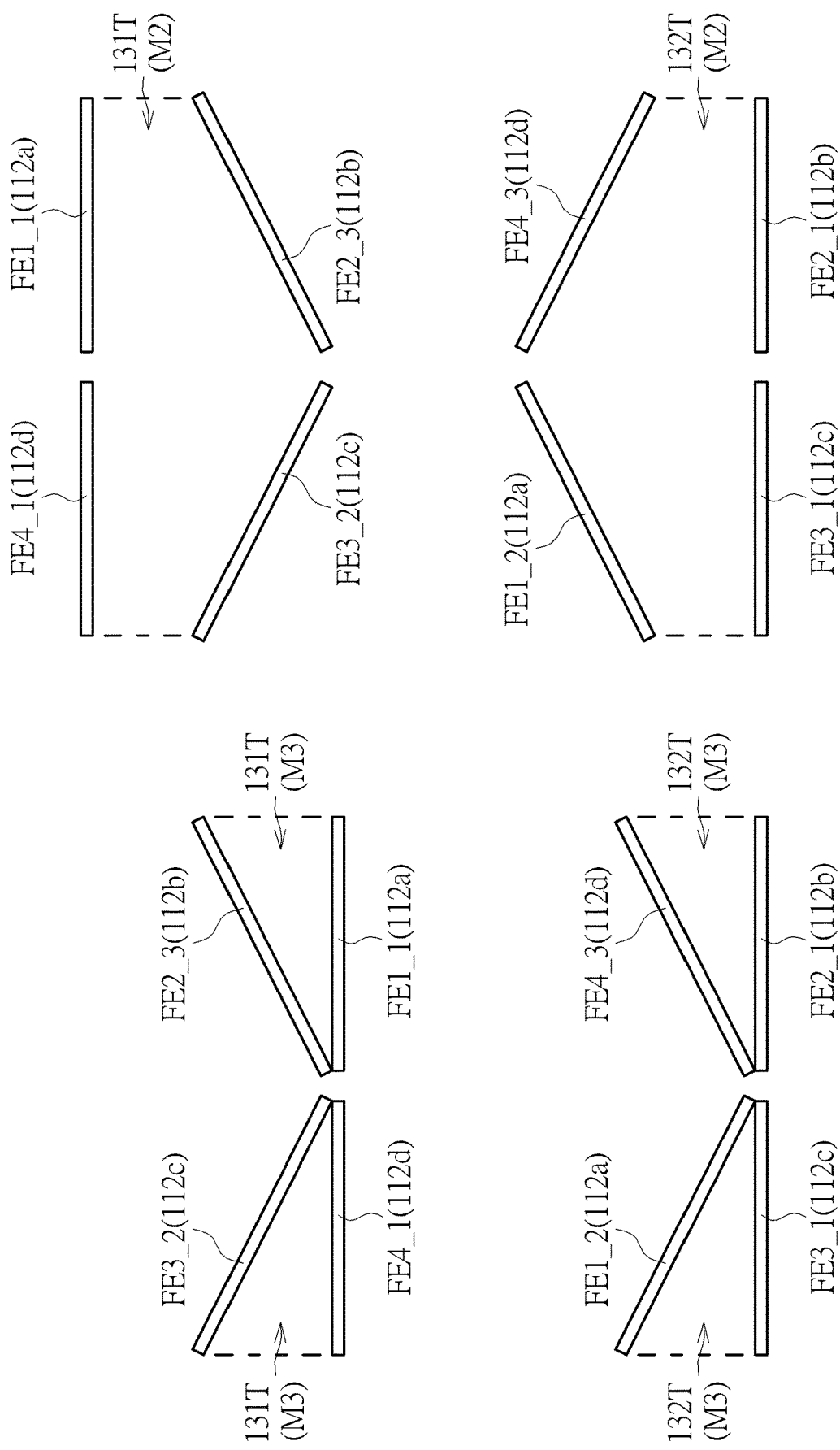
FIG. 17 is a schematic diagram illustrating side views of vents of the venting device in a second mode and a third mode according to the second embodiment of the present invention.

Referring to FIG. 16 and FIG. 17, FIG. 16 is a schematic diagram of a top view illustrating a venting device according to a second embodiment of the present invention, and FIG. 17 is a schematic diagram illustrating side views of vents of the venting device in a second/open mode and a third/comfort mode according to the second embodiment of the present invention, wherein FIG. 17 shows a side view of the first vent 131T along the direction Y and shows a side view of the second vent 132T along the direction X. As shown in FIG. 16, a difference between this embodiment and the first embodiment is the arrangement of the flaps 112 of the venting device 200. In FIG. 16, the membrane 110 has four flaps 112 arranged in a 2×2 array, but not limited thereto.

In FIG. 16, the first anchor edge AE1 and the fourth anchor edge AE4 may be parallel to the direction X, and the second anchor edge AE2 and the third anchor edge AE3 may be parallel to the direction Y (i.e., the second anchor edge AE2 and the third anchor edge AE3 may be perpendicular to the first anchor edge AE1 and the fourth anchor edge AE4). In the first flap 112a, the free edge FE1_1 is opposite to the first anchor edge AE1 in the direction Y, and the free edge FE1_2 and the free edge FE1_3 are opposite to each other in the direction X and between the free edge FE1_1 and the first anchor edge AE1. In the second flap 112b, the free edge FE2_1 is opposite to the second anchor edge AE2 in the direction X, and the free edge FE2_2 and the free edge FE2_3 are opposite to each other in the direction Y and between the free edge FE2_1 and the second anchor edge AE2. In the third flap 112c, the free edge FE3_1 is opposite to the third anchor edge AE3 in the direction X, and the free edge FE3_2 and the free edge FE3_3 are opposite to each other in the direction Y and between the free edge FE3_1 and the third anchor edge AE3. In the fourth flap 112d, the free edge FE4_1 is opposite to the fourth anchor edge AE4 in the direction Y, and the free edge FE4_2 and the free edge FE4_3 are opposite to each other in the direction X and between the free edge FE4_1 and the fourth anchor edge AE4.

In FIG. 16, the first slit 131 may define the free edge FE1_1 of the first flap 112a, the free edge FE2_3 of the second flap 112b, the free edge FE3_2 of the third flap 112c and the free edge FE4_1 of the fourth flap 112d, and the second slit 132 may define the free edge FE1_2 of the first flap 112a, the free edge FE2_1 of the second flap 112b, the free edge FE3_1 of the third flap 112c and the free edge FE4_3 of the fourth flap 112d. Furthermore, the slits 130 may optionally include a third slit 133, a fourth slit 134, a fifth slit 135 and a sixth slit 136 formed around the membrane 110 to define the boundaries of the membrane 110, wherein the third slit 133 may define the free edge FE1_3 of the first flap 112a, the fourth slit 134 may define the free edge FE2_2 of the second flap 112b, the fifth slit 135 may define the free edge FE3_3 of the third flap 112c, and the sixth slit 136 may define the free edge FE4_2 of the fourth flap 112d.

Thus, according to the arrangement of the flaps 112 and the arrangement of the slits 130, in FIG. 16, the free edges FE1_1 and FE1_2 of the first flap 112a may be respectively adjacent to the second flap 112b and the third flap 112c, the free edges FE2_1 and FE2_3 of the second flap 112b may be respectively adjacent to the fourth flap 112d and the first flap 112a, the free edges FE3_1 and FE3_2 of the third flap 112c may be respectively adjacent to the first flap 112a and the fourth flap 112d, and the free edges FE4_1 and FE4_3 of the fourth flap 112d may be respectively adjacent to the third flap 112c and the second flap 112b.

The first vent 131T may be formed between the free edge FE1_1 of the first flap 112a and the free edge FE2_3 of the second flap 112b and between the free edge FE3_2 of the third flap 112c and the free edge FE4_1 of the fourth flap 112d because of the first slit 131. The second vent 132T may be formed between the free edge FE1_2 of the first flap 112a and the free edge FE3_1 of the third flap 112c and between the free edge FE2_1 of the second flap 112b and the free edge FE4_3 of the fourth flap 112d because of the second slit 132.

The mode operation of the venting device 200 of this embodiment may be the same as the aforementioned first embodiment, and thus, the repeated parts will not be redundantly described.

As shown in FIG. 16 and FIG. 17, the side view shapes of the vents 130T are different from the aforementioned first embodiment. For example, as shown in FIG. 16 and FIG. 17, in the second/open mode M2 (two adjacent flaps 112 moves toward opposite directions), the first vent 131T may be formed in the direction Z and has a pentagonal shape, wherein an upper edge of the first vent 131T may be formed of the free edge FE1_1 of the first flap 112a and the free edge FE4_1 of the fourth flap 112d, and two lower edges of the first vent 131T may be respectively formed of the free edge FE2_3 of the second flap 112b and the free edge FE3_2 of the third flap 112c, but not limited thereto. For example, as shown in FIG. 16 and FIG. 17, in the second/open mode M2, the second vent 132T may be formed in the direction Z and has a pentagonal shape, wherein two upper edges of the second vent 132T may be respectively formed of the free edge FE1_2 of the first flap 112a and the free edge FE4_3 of the fourth flap 112d, and a lower edge of the second vent 132T may be formed of the free edge FE2_1 of the second flap 112b and the free edge FE3_1 of the third flap 112c, but not limited thereto.

For example, as shown in FIG. 16 and FIG. 17, in the third/comfort mode M3 (all flaps 112 bend downwards), the first vent 131T may be formed in the direction Z and has two triangles, wherein upper edges of the first vent 131T may be respectively formed of the free edge FE2_3 of the second flap 112b and the free edge FE3_2 of the third flap 112c, and lower edges of the first vent 131T may be respectively formed of the free edge FE1_1 of the first flap 112a and the free edge FE4_1 of the fourth flap 112d, but not limited thereto. For example, as shown in FIG. 16 and FIG. 17, in the third mode M3, the second vent 132T may be formed in the direction Z and has two triangles, wherein upper edges of the second vent 132T may be respectively formed of the free edge FE1_2 of the first flap 112a and the free edge FE4_3 of the fourth flap 112d, and lower edges of the second vent 132T may be respectively formed of the free edge FE2_1 of the second flap 112b and the free edge FE3_1 of the third flap 112c, but not limited thereto.

Figure 18:
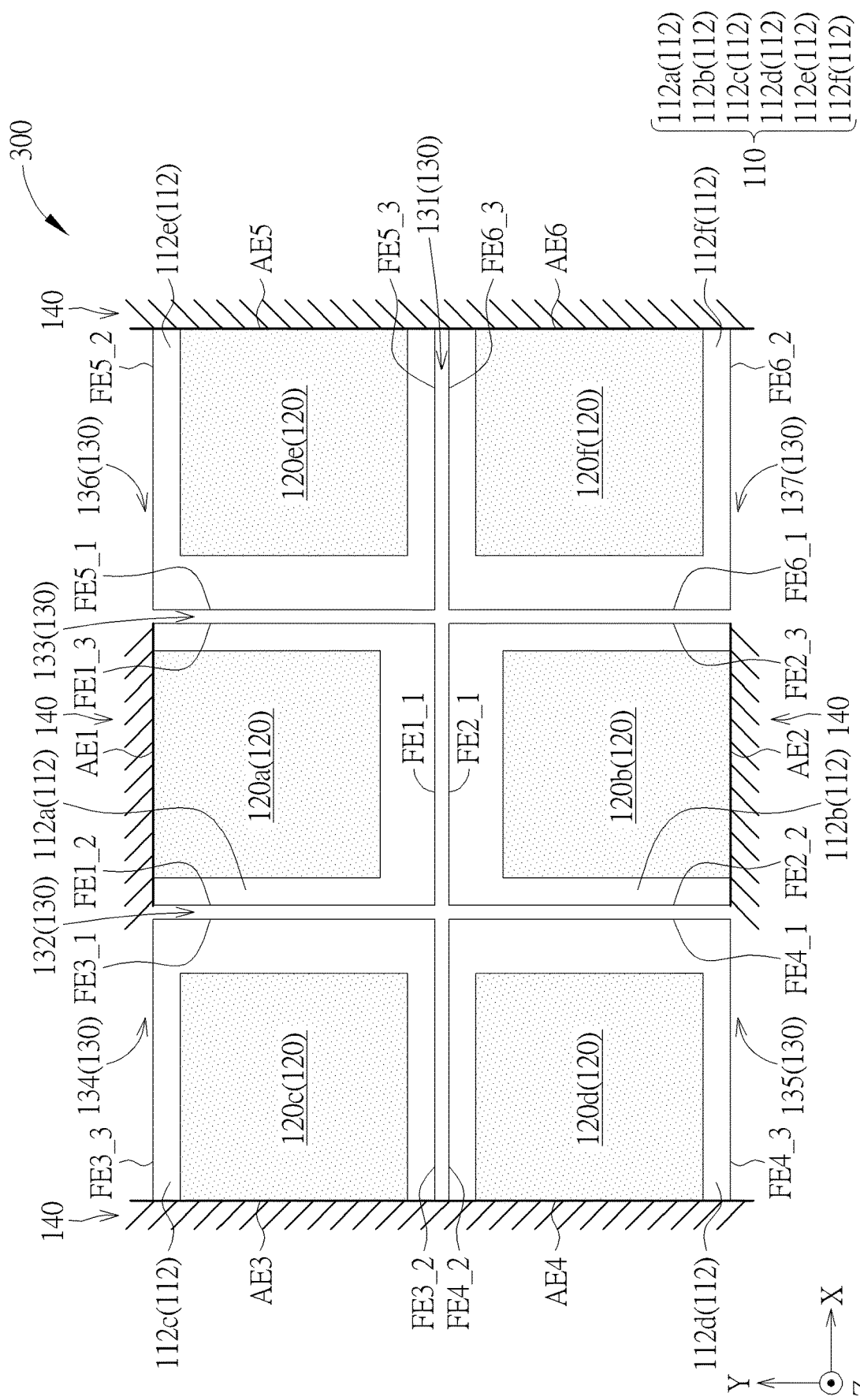
FIG. 18 is a schematic diagram of a top view illustrating a venting device according to a third embodiment of the present invention.
Figure 19:
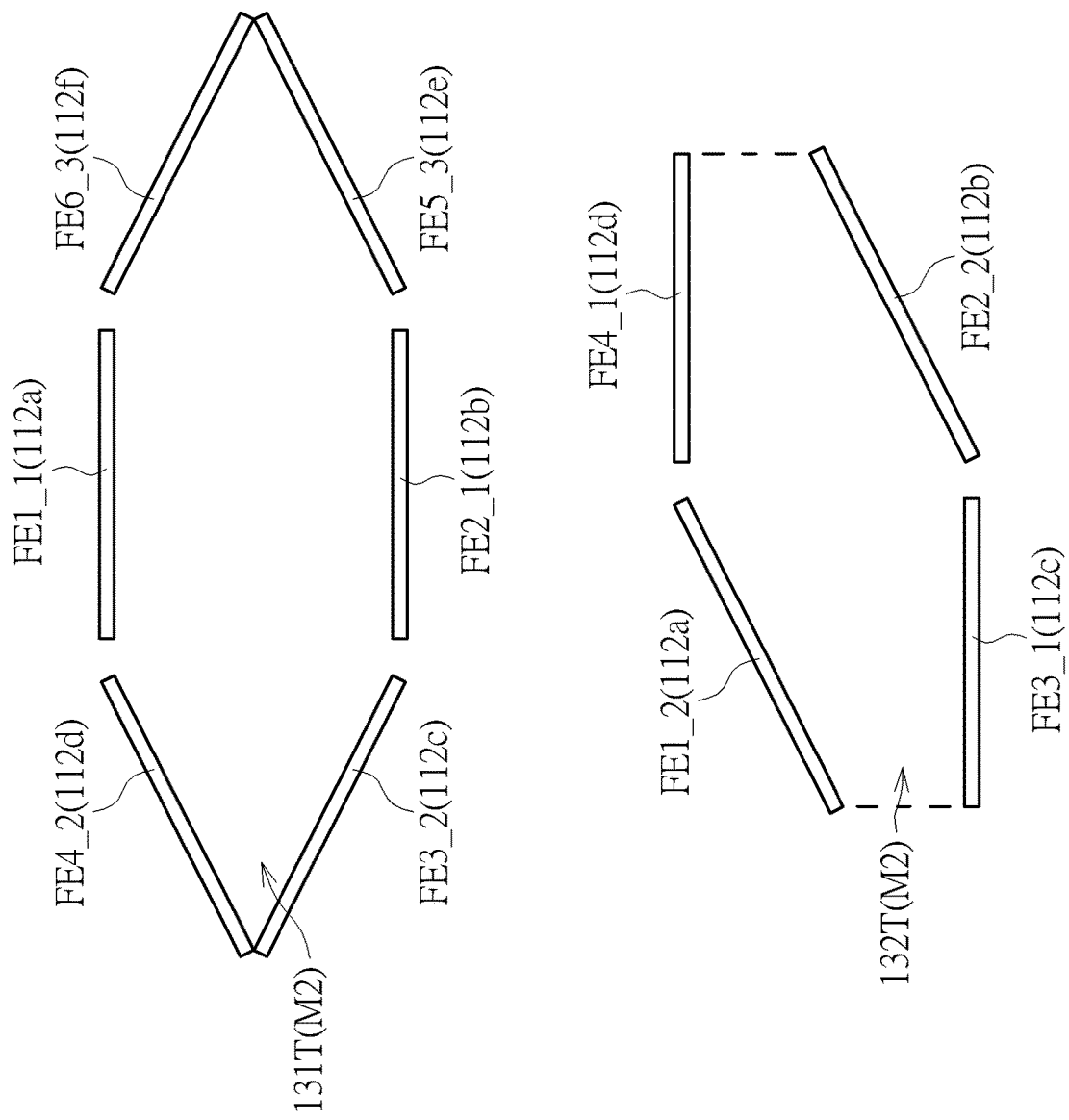
FIG. 19 is a schematic diagram illustrating side views of vents of the venting device in a second mode according to the third embodiment of the present invention.

Referring to FIG. 18 and FIG. 19, FIG. 18 is a schematic diagram of a top view illustrating a venting device according to a third embodiment of the present invention, and FIG. 19 is a schematic diagram illustrating side views of vents of the venting device in a second/open mode according to the third embodiment of the present invention, wherein FIG. 19 shows a side view of the first vent 131T along the direction Y and shows a side view of the second vent 132T along the direction X. As shown in FIG. 18, a difference between this embodiment and the first embodiment is the arrangement of the flaps 112 of the venting device 300.

In FIG. 18, the first anchor edge AE1 and the second anchor edge AE2 may be parallel to the direction X, and the third anchor edge AE3, the fourth anchor edge AE4, the fifth anchor edge AE5 and the sixth anchor edge AE6 may be parallel to the direction Y (i.e., the first anchor edge AE1 and the second anchor edge AE2 may be perpendicular to the third anchor edge AE3, the fourth anchor edge AE4, the fifth anchor edge AE5). In the first flap 112a, the free edge FE1_1 is opposite to the first anchor edge AE1 in the direction Y, and the free edge FE1_2 and the free edge FE1_3 are opposite to each other in the direction X and between the free edge FE1_1 and the first anchor edge AE1. In the second flap 112b, the free edge FE2_1 is opposite to the second anchor edge AE2 in the direction Y, and the free edge FE2_2 and the free edge FE2_3 are opposite to each other in the direction X and between the free edge FE2_1 and the second anchor edge AE2. In the third flap 112c, the free edge FE3_1 is opposite to the third anchor edge AE3 in the direction X, and the free edge FE3_2 and the free edge FE3_3 are opposite to each other in the direction Y and between the free edge FE3_1 and the third anchor edge AE3. In the fourth flap 112d, the free edge FE4_1 is opposite to the fourth anchor edge AE4 in the direction X, and the free edge FE4_2 and the free edge FE4_3 are opposite to each other in the direction Y and between the free edge FE4_1 and the fourth anchor edge AE4. In the fifth flap 112e, the free edge FE5_1 is opposite to the fifth anchor edge AE5 in the direction X, and the free edge FE5_2 and the free edge FE5_3 are opposite to each other in the direction Y and between the free edge FE5_1 and the fifth anchor edge AE5. In the sixth flap 112f, the free edge FE6_1 is opposite to the sixth anchor edge AE6 in the direction X, and the free edge FE6_2 and the free edge FE6_3 are opposite to each other in the direction Y and between the free edge FE6_1 and the sixth anchor edge AE6.

The first slit 131 may define the free edge FE1_1 of the first flap 112a, the free edge FE2_1 of the second flap 112b, the free edge FE3_2 of the third flap 112c, the free edge FE4_2 of the fourth flap 112d, the free edge FE5_3 of the fifth flap 112e and the free edge FE6_3 of the sixth flap 112f. The second slit 132 may define the free edge FE1_2 of the first flap 112a, the free edge FE2_2 of the second flap 112b, the free edge FE3_1 of the third flap 112c and the free edge FE4_1 of the fourth flap 112d. The third slit 133 may define the free edge FE1_3 of the first flap 112a, the free edge FE2_3 of the second flap 112b, the free edge FE5_1 of the fifth flap 112e and the free edge FE6_1 of the sixth flap 112f. Furthermore, the slits 130 may optionally include a fourth slit 134, a fifth slit 135, a sixth slit 136 and a seventh slit 137 formed around the membrane 110 to define the boundaries of the membrane 110, wherein the fourth slit 134 may define the free edge FE3_3 of the third flap 112c, the fifth slit 135 may define the free edge FE4_3 of the fourth flap 112d, the sixth slit 136 may define the free edge FE5_2 of the fifth flap 112e, and the seventh slit 137 may define the free edge FE6_2 of the sixth flap 112f.

Thus, according to the arrangement of the flaps 112 and the arrangement of the slits 130, in FIG. 18, the free edges FE1_1, FE1_2 and FE1_3 of the first flap 112a may be respectively adjacent to the second flap 112b, the third flap 112c and the fifth flap 112e, the free edges FE2_1, FE2_2 and FE2_3 of the second flap 112b may be respectively adjacent to the first flap 112a, the fourth flap 112d and the sixth flap 112f, the free edges FE3_1 and FE3_2 of the third flap 112c may be respectively adjacent to the first flap 112a and the fourth flap 112d, the free edges FE4_1 and FE4_2 of the fourth flap 112d may be respectively adjacent to the second flap 112b and the third flap 112c, the free edges FE5_1 and FE5_3 of the fifth flap 112e may be respectively adjacent to the first flap 112a and the sixth flap 112f, and the free edges FE6_1 and FE6_3 of the sixth flap 112f may be respectively adjacent to the second flap 112b and the fifth flap 112e.

The first vent 131T may be formed between the free edge FE1_1 of the first flap 112a and the free edge FE2_1 of the second flap 112b, between the free edge FE3_2 of the third flap 112c and the free edge FE4_2 of the fourth flap 112d and between the free edge FE5_3 of the fifth flap 112e and the free edge FE6_3 of the sixth flap 112f because of the first slit 131. The second vent 132T may be formed between the free edge FE1_2 of the first flap 112a and the free edge FE3_1 of the third flap 112c and between the free edge FE2_2 of the second flap 112b and the free edge FE4_1 of the fourth flap 112d because of the second slit 132. The third vent 133T may be formed between the free edge FE1_3 of the first flap 112a and the free edge FE5_1 of the fifth flap 112e and between the free edge FE2_3 of the second flap 112b and the free edge FE6_1 of the sixth flap 112f because of the third slit 133.

The mode operation of the venting device 300 of this embodiment may be the same as the aforementioned first embodiment, and thus, the repeated parts will not be redundantly described.

As shown in FIG. 18 and FIG. 19, the side view shapes of the vents 130T are different from the aforementioned first embodiment. For example, as shown in FIG. 18 and FIG. 19, in the second/open mode M2 (two adjacent flaps 112 moves toward opposite directions), the first vent 131T may be formed in the direction Z and has a hexagonal shape, wherein three upper edges of the first vent 131T may be respectively formed of the free edge FE1_1 of the first flap 112a, the free edge FE4_2 of the fourth flap 112d and the free edge FE6_3 of the sixth flap 112f, and three lower edges of the first vent 131T may be respectively formed of the free edge FE2_1 of the second flap 112b, the free edge FE3_2 of the third flap 112c and the free edge FE5_3 of the fifth flap 112e, but not limited thereto. For example, as shown in FIG. 18 and FIG. 19, in the second mode M2, the second vent 132T may be formed in the direction Z and has a hexagonal shape, wherein two upper edges of the second vent 132T may be respectively formed of the free edge FE1_2 of the first flap 112a and the free edge FE4_1 of the fourth flap 112d, and two lower edges of the second vent 132T may be formed of the free edge FE2_2 of the second flap 112b and the free edge FE3_1 of the third flap 112c, but not limited thereto. For example, in the second mode M2, the third vent 133T may be similar to the second vent 132T, such that the third vent 133T may be formed in the direction Z and has a hexagonal shape, wherein two upper edges of the third vent 133T may be respectively formed of the free edge FE1_3 of the first flap 112a and the free edge FE6_1 of the sixth flap 112f, and two lower edges of the third vent 133T may be formed of the free edge FE2_3 of the second flap 112b and the free edge FE5_1 of the fifth flap 112e, but not limited thereto.

For example, in the third/comfort mode M3 (all flaps 112 bend downwards), the second vent 132T may be formed in the direction Z and has two triangles (similar to the second vent 132T in the third mode M3 shown in FIG. 17), wherein upper edges of the second vent 132T may be respectively formed of the free edge FE1_2 of the first flap 112a and the free edge FE2_2 of the second flap 112b, and lower edges of the second vent 132T may be respectively formed of the free edge FE3_1 of the third flap 112c and the free edge FE4_1 of the fourth flap 112d, but not limited thereto. For example, in the third mode M3, the third vent 133T may be formed in the direction Z and has two triangles (similar to the second vent 132T in the third mode M3 shown in FIG. 17), wherein upper edges of the third vent 133T may be respectively formed of the free edge FE1_3 of the first flap 112a and the free edge FE2_3 of the second flap 112b, and lower edges of the third vent 133T may be respectively formed of the free edge FE5_1 of the fifth flap 112e and the free edge FE6_1 of the fifth flap 112e, but not limited thereto.

Figure 20:
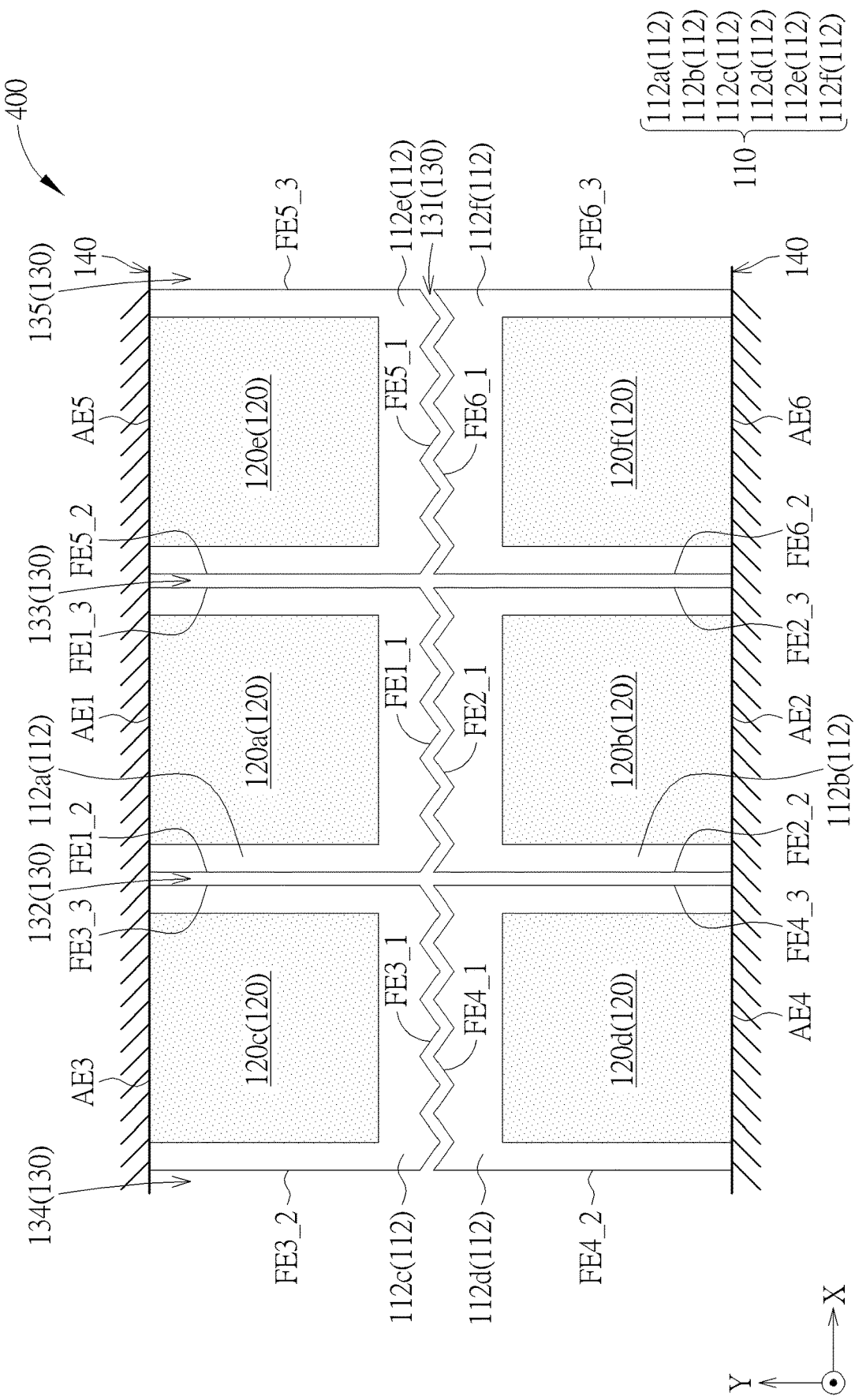
FIG. 20 is a schematic diagram of a top view illustrating a venting device according to a fourth embodiment of the present invention.

Referring to FIG. 20, FIG. 20 is a schematic diagram of a top view illustrating a venting device according to a fourth embodiment of the present invention. As shown in FIG. 20, a difference between this embodiment and the first embodiment is the design of the first slit 131 of the venting device 400. In FIG. 20, the first slit 131 is a saw-shaped/zigzagging slit, such that the free edges FE1_1 and FE2_1 are saw-shaped/zigzagging edges corresponding to each other, the free edges FE3_1 and FE4_1 are saw-shaped/zigzagging edges corresponding to each other, and the free edges FE5_1 and FE6_1 are saw-shaped/zigzagging edges corresponding to each other.

As shown in FIG. 20, the zigzagging pattern of the slit 130 may be a saw pattern, such that the saw-shaped/zigzagging edge includes a plurality of units having at least one suitable sub-edge (e.g., a straight edge, a curved edge). For example, the unit may have two connected sub-edges which are straight bevel edges, but not limited thereto.

Because these free edges are saw-shaped/zigzagging edges (the first slit 131 is the saw-shaped slit), the length of the first vent 131T is enhanced, so as to enhance the airflow passing through the first vent 131T and reduce the acoustic resistance of the first vent 131T.

In the manufacturing method of the venting device 400 of this embodiment, the trench line TL is formed to be saw-shaped or zigzagging-shaped (e.g., in the step shown in FIG. 12), so as to make the related slit 130 be the saw-shaped/zigzagging slit. For example, in this embodiment, the trench line TL corresponding to the first slit 131 is formed to be saw-shaped, so as to make the first slit 131 be the saw-shaped/zigzagging slit.

Figure 21:
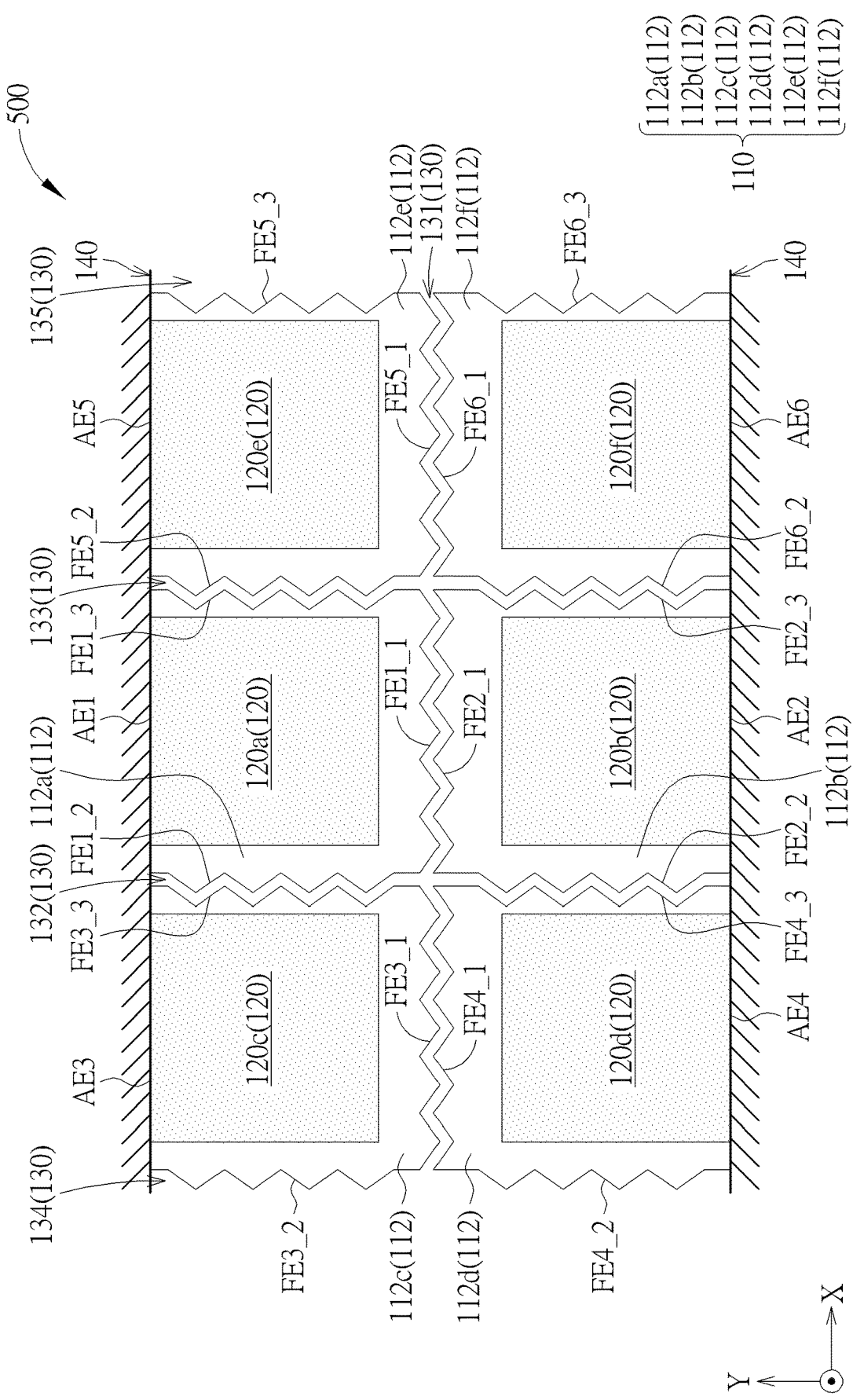
FIG. 21 is a schematic diagram of a top view illustrating a venting device according to a fifth embodiment of the present invention.

Referring to FIG. 21, FIG. 21 is a schematic diagram of a top view illustrating a venting device according to a fifth embodiment of the present invention. As shown in FIG. 21, a difference between this embodiment and the fourth embodiment is the design of other slits 130 of the venting device 500. The second slit 132 is a saw-shaped/zigzagging slit, such that the free edges FE1_2 and FE3_3 are saw-shaped/zigzagging edges corresponding to each other, and the free edges FE2_2 and FE4_3 are saw-shaped/zigzagging edges corresponding to each other. The third slit 133 is a saw-shaped/zigzagging slit, such that the free edges FE1_3 and FE5_2 are saw-shaped/zigzagging edges corresponding to each other, and the free edges FE2_3 and FE6_2 are saw-shaped/zigzagging edges corresponding to each other.

Optionally, the fourth slit 134 may be a saw-shaped/zigzagging slit, such that the free edges FE3_2 and FE4_2 are saw-shaped/zigzagging edges. Optionally, the fifth slit 135 may be a saw-shaped/zigzagging slit, such that the free edges FE5_3 and FE6_3 are saw-shaped/zigzagging edges.

Accordingly, since the number of the saw-shaped/zigzagging edges is increased, the lengths of the vents 130T are further enhanced, so as to enhance the airflow passing through the vents 130T and reduce the acoustic resistances of the vents 130T.

Figure 22:
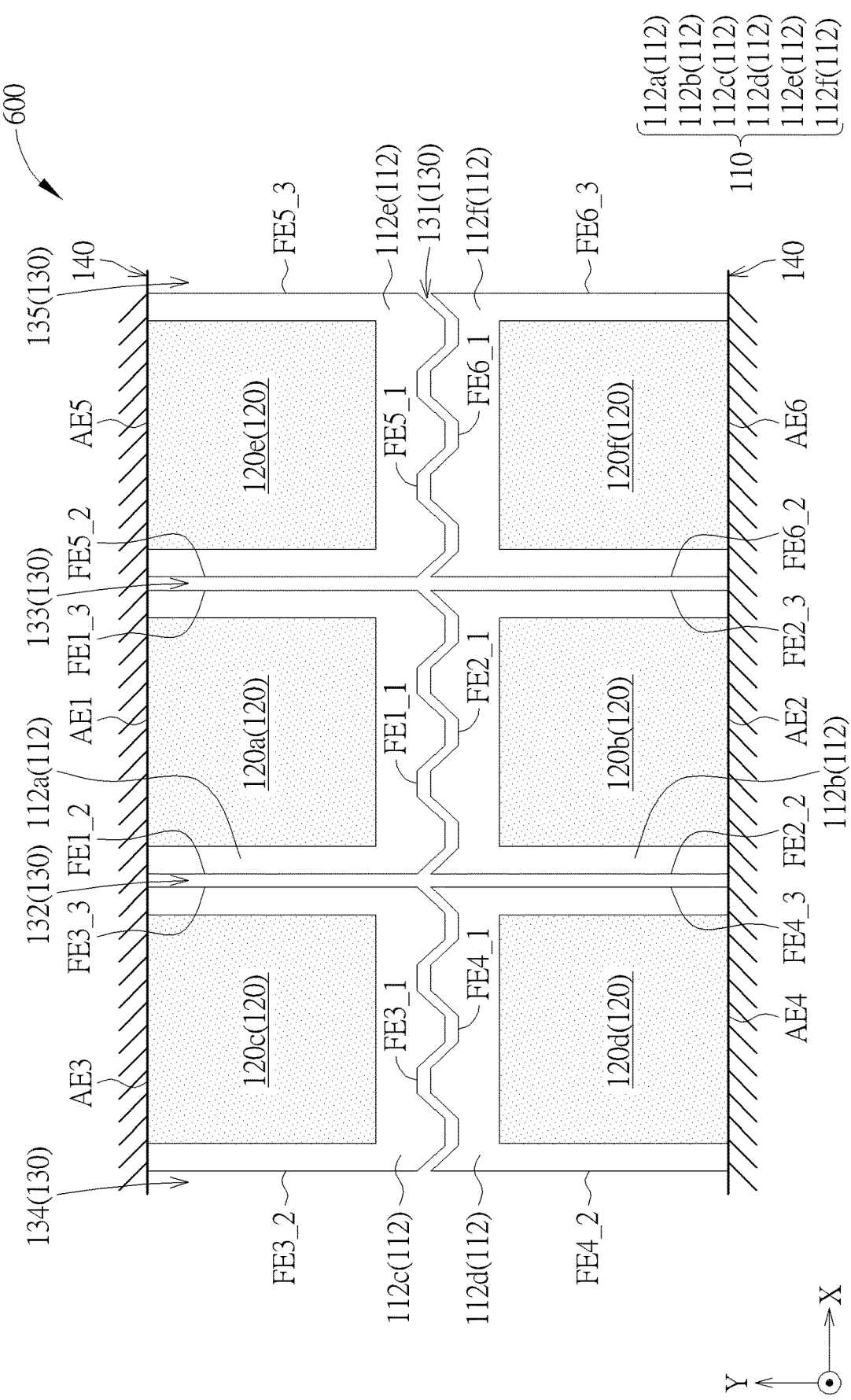
FIG. 22 is a schematic diagram of a top view illustrating a venting device according to a sixth embodiment of the present invention.

Referring to FIG. 22, FIG. 22 is a schematic diagram of a top view illustrating a venting device according to a sixth embodiment of the present invention. As shown in FIG. 22, a difference between this embodiment and the fourth embodiment is the design of the units of the saw-shaped edge of the venting device 600. In FIG. 22, the zigzagging pattern of the slit 130 may be a trapezoidal pattern, such that the unit of the saw-shaped/zigzagging edge may have three connected sub-edges, wherein two sub-edges may be straight bevel edges, and one sub-edge connected between two straight bevel edges may be a straight horizontal edge, but not limited thereto.

According to the above, at least one saw-shaped slit may be used in one of the aforementioned venting devices 100, 200, 300 to form a variant embodiment, wherein the number of the saw-shaped/zigzagging slit(s) 130 may be designed based on requirement(s), and the units of the saw-shaped/zigzagging slit may be designed based on requirement(s).

Figure 23:
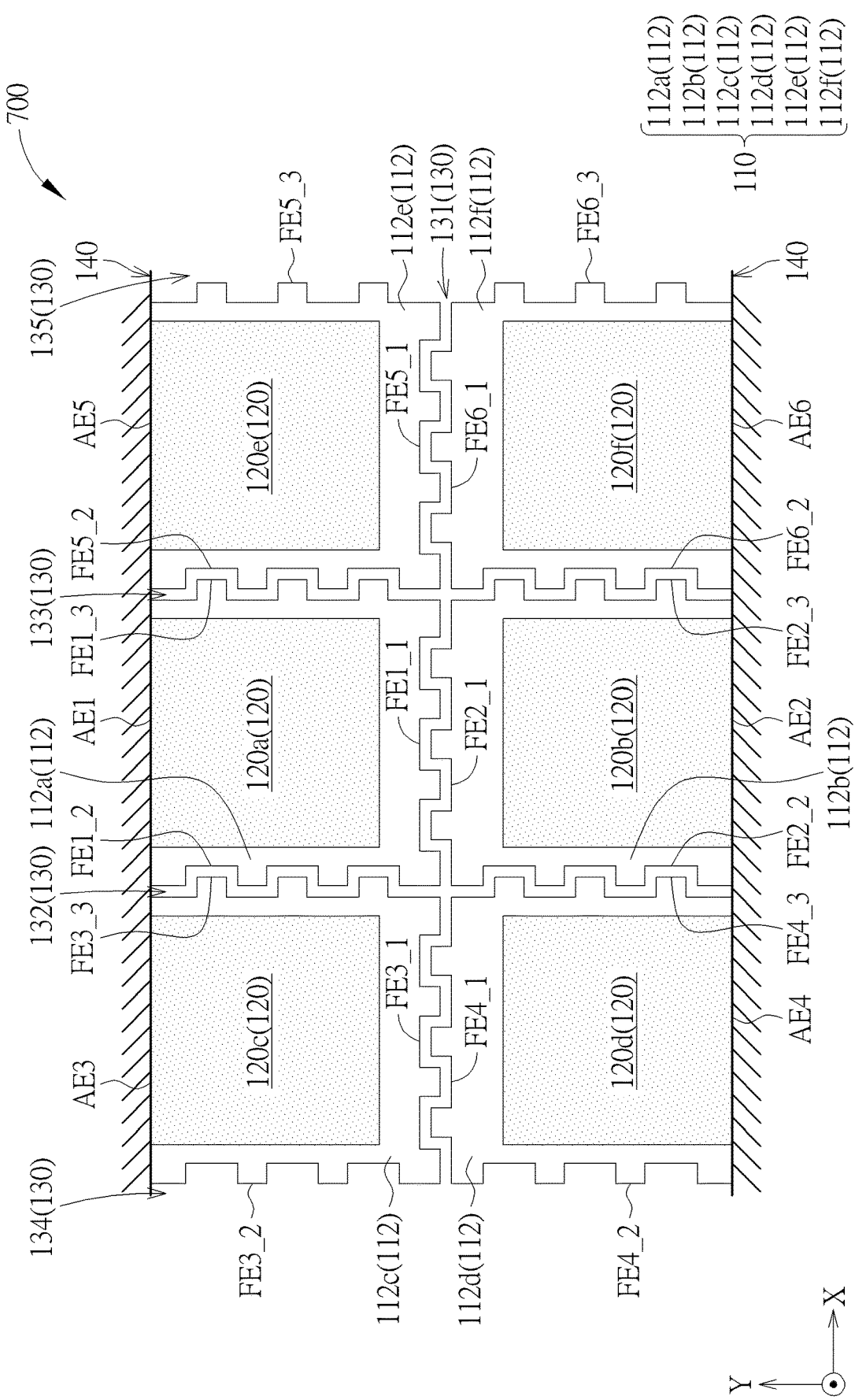
FIG. 23 is a schematic diagram of a top view illustrating a venting device according to a seventh embodiment of the present invention.
Figure 24:
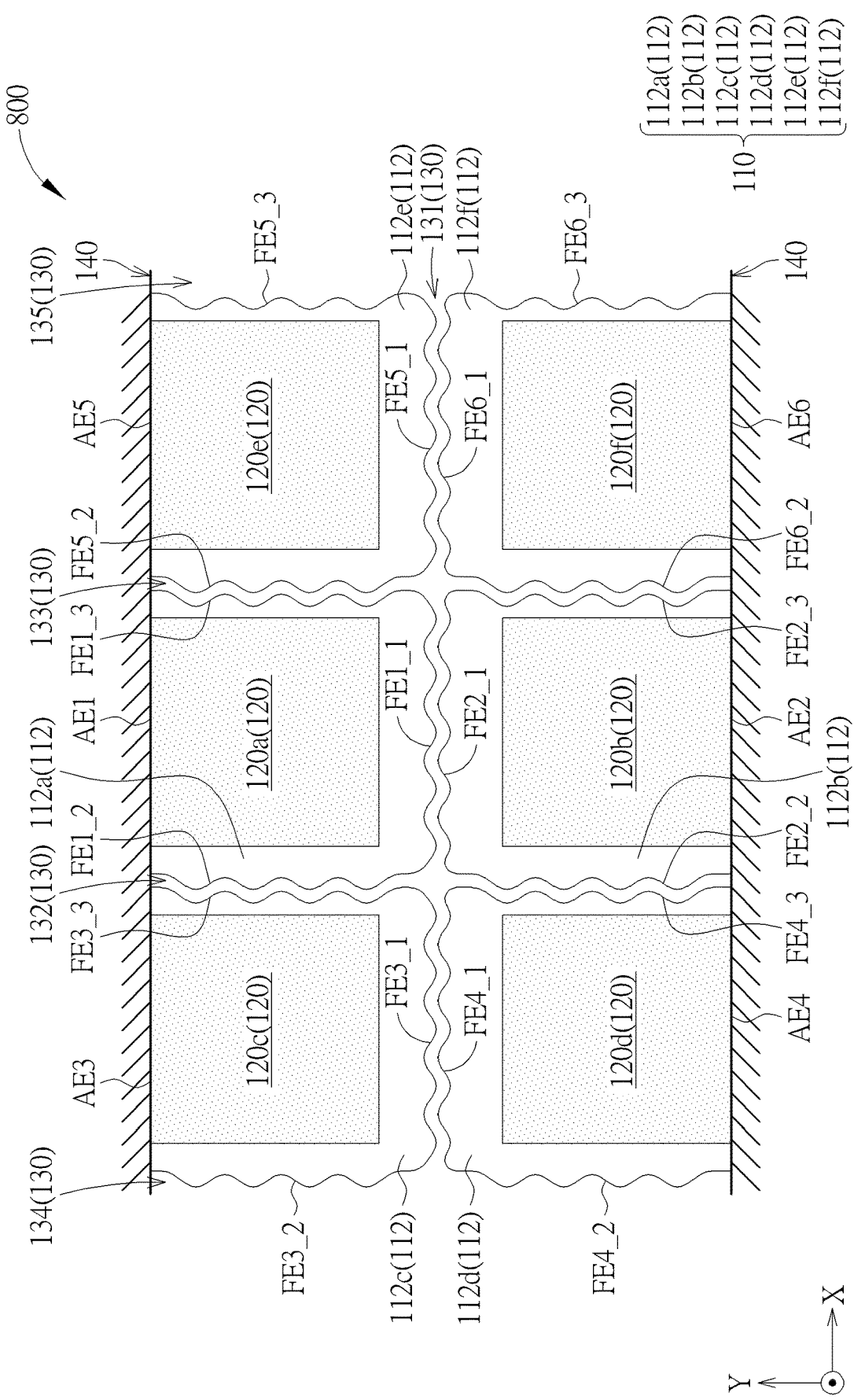
FIG. 24 is a schematic diagram of a top view illustrating a venting device according to an eighth embodiment of the present invention.

Note that, the zigzagging slit is not limited to be saw-shaped or having the saw pattern. The slit formed on the membrane may have a trapezoidal pattern (FIG. 22), a rectangular pattern (FIG. 23), a sinusoidal pattern (FIG. 24), a polynomial pattern (similar to FIG. 24), tooth pattern or other suitable pattern, which are all within the scope of the present invention. The polynomial pattern means that the membrane is patterned to form slit such that a segment of the slit may (substantially) match a polynomial function.

More generally, as long as a segment of a slit formed on the membrane zigzags on the membrane (such that acoustic resistance corresponding to the vent formed thereon is reduced compared to the straight-line slit), it is within the scope of the present invention. Moreover, the slit 130 may be regarded as extending toward a direction. For example, the first slit 131 may be regarded as extending toward the direction X and the second slit 132 may be regarded as extending toward the direction Y. The first slit 131 and the second slit 132 shown in FIGS. 21-24 may be regarded as zigzaging on the membrane 110 and (respectively) extending toward the direction X and Y. In the present invention, segment of slit with zigzagging pattern may refer that: 1) the segment of the slit comprises no straight-line pattern; or 2) the segment of the slit alters/changes its direction in a back-and-forth manner, regardless how frequently (in spatial domain/dimension) slit direction alters.

In summary, the present invention utilizes the third flap moving toward opposite direction, with respect to which of the first flap to widen the vent opening of the second vent, so as to reduce acoustic resistance. Furthermore, the present invention utilizes the zigzagging slit(s) to lengthen slit length, so as to reduce acoustic resistance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A venting device, comprising:
   an anchor structure; and
   a membrane anchored on the anchor structure and configured to form a first vent and a second vent;
   wherein the membrane comprises a first flap, a second flap and a third flap;
   wherein the membrane partitions a space into a first volume and a second volume, and the first volume and the second volume are connected when the first vent and the second vent are formed;

wherein the first flap is actuated to move toward a first direction and the second flap is actuated to move toward a second direction opposite to the first direction, so as to form the first vent;
wherein the first flap is actuated to move toward the first direction and the third flap is actuated to move toward the second direction opposite to the first direction, so as to form the second vent.

2. The venting device of claim 1, wherein the first flap is adjacent to the second flap, and the first flap is adjacent to the third flap.

3. The venting device of claim 1, wherein the membrane further comprises a fourth flap separated from the first flap, the second flap and the third flap.

4. The venting device of claim 1, wherein the first flap comprises a first free edge adjacent to the second flap and a second free edge adjacent to the third flap, the first vent is formed between the first free edge of the first flap and the second flap, and the second vent is formed between the second free edge of the first flap and the third flap.

5. The venting device of claim 4, wherein the first flap comprises a first anchor edge, the first free edge is opposite to the first anchor edge, and the second free edge is between the first free edge and the first anchor edge.

6. The venting device of claim 5,
wherein the second flap comprises a second anchor edge, a third free edge opposite to the second anchor edge and a fourth free edge between the third free edge and the second anchor edge;
wherein the third flap comprises a third anchor edge, a fifth free edge opposite to the third anchor edge and a sixth free edge between the fifth free edge and the third anchor edge;
wherein the first vent is formed between the first free edge of the first flap and the fourth free edge of the second flap, and the second vent is formed between the second free edge of the first flap and the fifth free edge of the third flap.

7. The venting device of claim 5,
wherein the second flap comprises a second anchor edge and a third free edge opposite to the second anchor edge;
wherein the third flap comprises a third anchor edge, a fifth free edge opposite to the third anchor edge and a sixth free edge between the fifth free edge and the third anchor edge;
wherein the first vent is formed between the first free edge of the first flap and the third free edge of the second flap, and the second vent is formed between the second free edge of the first flap and the sixth free edge of the third flap.

8. The venting device of claim 5,
wherein the second flap comprises a second anchor edge, a third free edge opposite to the second anchor edge and a fourth free edge between the third free edge and the second anchor edge;
wherein the third flap comprises a third anchor edge, a fifth free edge opposite to the third anchor edge and a sixth free edge between the fifth free edge and the third anchor edge;
wherein the first vent is formed between the first free edge of the first flap and the third free edge of the second flap, and the second vent is formed between the second free edge of the first flap and the fifth free edge of the third flap.

9. The venting device of claim 5,
wherein the second flap comprises a second anchor edge, a third free edge opposite to the second anchor edge and a fourth free edge between the third free edge and the second anchor edge;
wherein the third flap comprises a third anchor edge, a fifth free edge opposite to the third anchor edge and a sixth free edge between the fifth free edge and the third anchor edge;
wherein the first vent is formed between the first free edge of the first flap and the fourth free edge of the second flap, and the second vent is formed between the second free edge of the first flap and the sixth free edge of the third flap.

10. The venting device of claim 1, wherein the first flap has a free edge adjacent to the second flap, the second flap has an edge adjacent to the first flap, the first vent is formed between the free edge of the first flap and the edge of the second flap, and the free edge of the first flap and the edge of the second flap are saw-shaped edges.

11. The venting device of claim 1, wherein the first flap has a free edge adjacent to the third flap, the third flap has an edge adjacent to the first flap, the second vent is formed between the free edge of the first flap and the edge of the third flap, and the free edge of the first flap and the edge of the third flap are saw-shaped edges.

12. The venting device of claim 1, wherein the venting device is operated in a first mode, a second mode or a third mode.

13. The venting device of claim 12, wherein in the first mode, the membrane is actuated to be maintained as a first position, and the first position is parallel to a base on which the venting device is disposed.

14. The venting device of claim 12, wherein in the second mode, the first flap is actuated to move toward the first direction, and the second flap and the third flap are actuated to move toward the second direction opposite to the first direction, such that the first vent and the second vent are formed.

15. The venting device of claim 12, wherein in the third mode, no power is applied to actuators disposed on the membrane or the first flap, the second flap and the third flap are below a first position, and the first position is parallel to a base on which the venting device is disposed.

16. The venting device of claim 12, wherein a total size of the first vent and the second vent in the second mode is greater than a total size of the first vent and the second vent in the third mode, and the total size of the first vent and the second vent in the third mode is greater than a total size of the first vent and the second vent in the first mode.

17. The venting device of claim 1,
wherein the venting device is disposed within a wearable sound device or to be disposed within the wearable sound device;
wherein the wearable sound device is an earbud or a hearing aid;
wherein the wearable sound device comprises an acoustic transducer configured to perform an acoustic transformation.

18. The venting device of claim 1,
wherein the first flap comprises a first anchor edge, the second flap comprises a second anchor edge, and the third flap comprises a third anchor edge;
wherein the first anchor edge, the second anchor edge and the third anchor edge are anchored on the anchor structure;

wherein the second anchor edge and the third anchor edge are parallel to the first anchor edge.

19. The venting device of claim 1,
wherein the first flap comprises a first anchor edge, the second flap comprises a second anchor edge, and the third flap comprises a third anchor edge;
wherein the first anchor edge, the second anchor edge and the third anchor edge are anchored on the anchor structure;
wherein the second anchor edge and the third anchor edge are perpendicular to the first anchor edge.

20. The venting device of claim 1,
wherein the first flap comprises a first anchor edge, the second flap comprises a second anchor edge, and the third flap comprises a third anchor edge;
wherein the first anchor edge, the second anchor edge and the third anchor edge are anchored on the anchor structure;
wherein the first anchor edge and the second anchor edge are perpendicular to the third anchor edge.

21. The venting device of claim 1,
wherein the first flap comprises a first anchor edge, the second flap comprises a second anchor edge, and the third flap comprises a third anchor edge;
wherein the first anchor edge, the second anchor edge and the third anchor edge are anchored on the anchor structure;
wherein the first anchor edge and the third anchor edge are perpendicular to the second anchor edge.

22. A venting device, comprising:
an anchor structure; and
a membrane anchored on the anchor structure and configured to form a vent, wherein the membrane comprises a first flap and a second flap;
wherein the membrane partitions a space into a first volume and a second volume, and the first volume and the second volume are connected via the vent when the vent is formed;
wherein a slit is formed on the membrane and the vent is formed because of the slit;
wherein a segment of the slit zigzags on the membrane;
wherein the first flap is actuated to move toward a first direction and the second flap is actuated to move toward a second direction opposite to the first direction, so as to form the vent.

23. The venting device of claim 22, wherein the slit has a zigzagging pattern which is a saw pattern, a tooth pattern, a trapezoidal pattern, a rectangular pattern, a sinusoidal pattern or a polynomial pattern.

24. A manufacturing method of a venting device, comprising:
providing a wafer comprising a first layer and a second layer, wherein the first layer comprises a membrane; and
patterning the first layer of the wafer to form a plurality of slits, such that the membrane comprises a first flap, a second flap and a third flap separated from each other by the slits;
wherein the membrane is configured to be controlled to form a plurality vents because of the plurality of slits;
wherein the slits comprises a first slit and a second slit, and the vents comprise a first vent and a second vent;
wherein the first slit is formed between the first flap and the second flap, and the second slit is formed between the first flap and the third flap;
wherein the first flap is actuated to move toward a first direction and the second flap is actuated to move toward a second direction opposite to the first direction, so as to form the first vent;
wherein the first flap is actuated to move toward the first direction and the third flap is actuated to move toward the second direction opposite to the first direction, so as to form the second vent.

25. The manufacturing method of claim 24, comprising:
forming the first slit or the second slit to have a pattern which is one of a saw pattern, a tooth pattern, a trapezoidal pattern, a rectangular pattern, a polynomial pattern and a sinusoidal pattern.

26. A venting method, applied in the venting device manufactured via the manufacturing method of claim 24, the venting method comprising:
actuating the first flap toward the first direction; and
actuating the second flap and the third flap toward the second direction opposite to the first direction;
wherein the first vent is formed between the first flap and the second flap because of the first slit, and the second vent is formed between the first flap and the third flap because of the second slit.

27. A manufacturing method of a venting device, comprising:
providing a wafer comprising a first layer and a second layer, wherein the first layer comprises a membrane; and
patterning the first layer of the wafer to form a zigzagging slit, wherein the zigzagging slit zigzags on the membrane and extends toward a direction, and the membrane comprises a first flap and a second flap separated from each other by the zigzagging slit;
wherein the membrane is configured to be controlled to form a vent, and the vent is formed because of the zigzagging slit;
wherein the first flap is actuated to move toward a first direction and the second flap is actuated to move toward a second direction opposite to the first direction, so as to form the vent.

* * * * *